(12) United States Patent
Sakuyama et al.

(10) Patent No.: US 6,689,639 B2
(45) Date of Patent: Feb. 10, 2004

(54) METHOD OF MAKING SEMICONDUCTOR DEVICE

(75) Inventors: Seiki Sakuyama, Kawasaki (JP); Masayuki Ochiai, Kawasaki (JP); Ichiro Yamaguchi, Kawasaki (JP); Joji Fujimori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/291,766

(22) Filed: Nov. 12, 2002

(65) Prior Publication Data

US 2003/0096494 A1 May 22, 2003

(30) Foreign Application Priority Data

Nov. 15, 2001 (JP) .......................... 2001-350720
Aug. 27, 2002 (JP) .......................... 2002-247847

(51) Int. Cl.⁷ .................... H01L 21/44; H01L 21/48; H01L 21/50
(52) U.S. Cl. ...................................... 438/118
(58) Field of Search ................. 438/118, 124, 438/107–108, 613, 643, 678

(56) References Cited

U.S. PATENT DOCUMENTS 5,672,542 A    9/1997  Schwiebert et al.
6,028,011 A    2/2000  Takase et al.
6,465,879 B1 * 10/2002 Taguchi ................. 257/673

FOREIGN PATENT DOCUMENTS

| JP | 4-133330    | 5/1992  |
| JP | 6-140409    | 5/1994  |
| JP | 7-302972    | 11/1995 |
| JP | 11-340270   | 12/1999 |
| JP | 2002-164597 | 6/2000  |

OTHER PUBLICATIONS

Junji et al. "Solder Feed Method" Japanese Abstract Publication No. 07–302972 Nov. 14, 1995. (Abstract only).*

* cited by examiner

Primary Examiner—Craig A. Thompson
(74) Attorney, Agent, or Firm—Staas & Halsey LLP

(57) ABSTRACT

A method of making a semiconductor device includes a resin film forming step for forming a resin film on a semiconductor substrate 10 provided with electrode portions 11 to cover the electrode portions 11, an opening forming step for forming openings in the resin film at locations corresponding to the electrode portions 11, a loading step for loading a bump material in the openings, a bump forming step for forming bumps 41 in the openings by heating, and a removing step for removing the resin film.

27 Claims, 13 Drawing Sheets

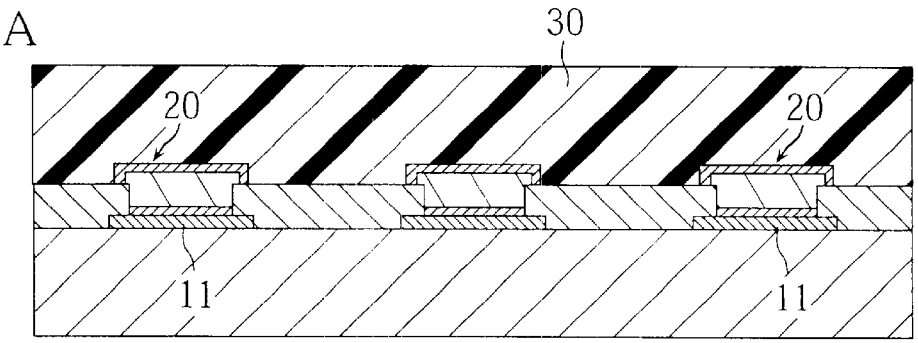
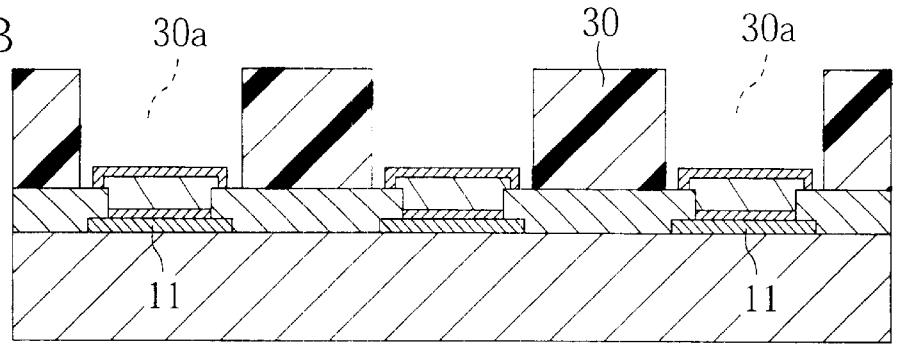
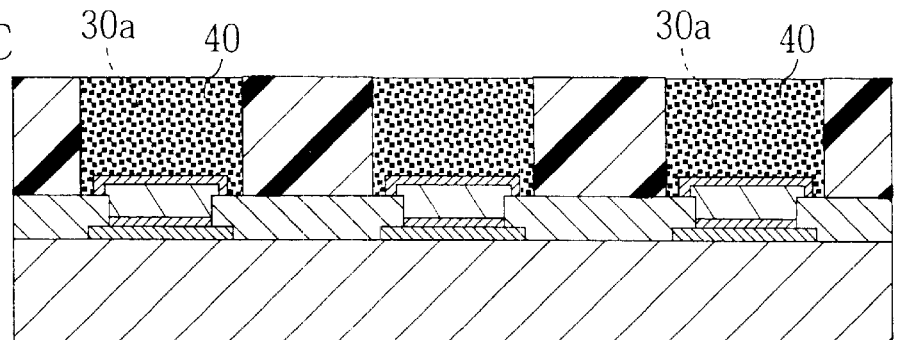
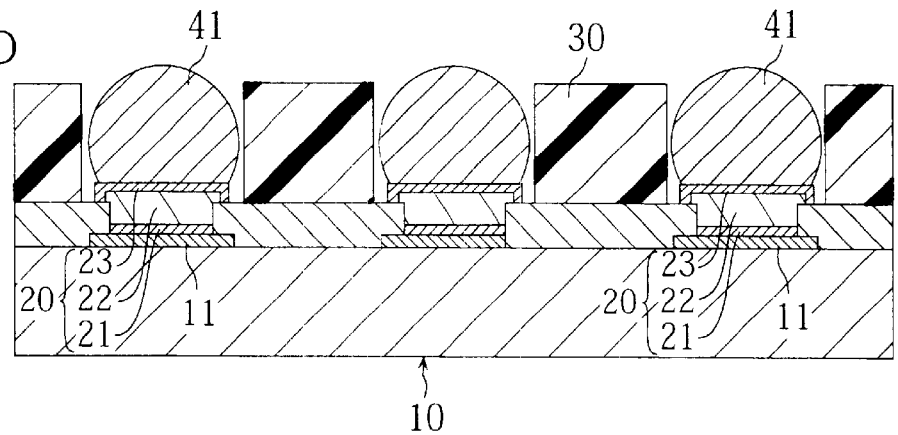

METHOD OF MAKING SEMICONDUCTOR DEVICE

TECHNICAL FIELD

The present invention relates to a method of making a semiconductor device such as a semiconductor chip provided with bump electrodes.

BACKGROUND ART

Recently, there is an increasing demand for mounting electronic components on a printed circuit board or on a ceramic board at high densities. As a method which meets such a demand, much attention is focused on bear chip mounting of semiconductor chips. In bear chip mounting, face-down mounting or flip-chip bonding is increasingly used instead of conventional face-up mounting. In the face-up mounting, wire-bonding is utilized to provide electrical connection between a semiconductor chip and a wiring pattern on a board. In the face-down mounting and the flip-chip bonding, a semiconductor chip having bump electrodes is mounted on a wiring board while providing connection between the bump electrodes and electrodes on the wiring board.

FIGS. 11a–13c illustrate an example of prior art method for making a semiconductor chip or semiconductor device having bump electrodes.

Firstly, in the prior art method, on a semiconductor substrate 60 as shown in FIG. 11a, a conductor film 63 for electroplating is formed, as shown in FIG. 11b. The semiconductor substrate 60 is, in advance, formed with a plurality of electrode portions 61 arranged at a predetermined pitch and a protective film 62 for protecting the obverse surface of the substrate. The electrode portions 61 comprise part of an Al wiring pattern or a Cu wiring pattern formed on the obverse surface of semiconductor substrate 60. The protective film 62 includes openings 62a at locations corresponding to the electrode portions 61. The conductor film 63 is formed by applying Ti, Ni or Cu by sputtering or vapor deposition to cover the surfaces of the electrode portions 61 and the protective film 62.

Subsequently, as shown in FIG. 11c, a resin film 64 is formed on the semiconductor substrate 60. Specifically, a photosensitive liquid resin composite is applied to the semiconductor substrate 60 by spin-coating.

Then, as shown in FIG. 12a, openings 64a are formed in the resin film 64. Specifically, the openings 64a are formed in the resin film 64 at locations corresponding to the electrode portions 61 by a light-exposure process using a predetermined mask (not shown) and the subsequent developing process.

Subsequently, as shown in FIG. 12b, barrier metal layers 65 are formed at the openings 62a and the openings 64a by electroplating. The barrier metal layers 65 are provided to prevent the wiring material of the electrode portions 61 from diffusing toward solder bumps which will be described later and to prevent the solder component of the solder bumps from diffusing toward the electrode portions 61. Instead of the electroplating, the barrier metal layers may be formed by electroless plating, as disclosed in JP-A-6-140409, for example.

Then, as shown in FIG. 12c, solder plating 66 as a bump material is deposited at each of the openings 64a by electroplating.

Subsequently, as shown in FIG. 13a, the protective film 64 is removed by using a predetermined stripping agent. Then, as shown in FIG. 13b, the exposed portions of the conductor film 63 are etched away. Then, as shown in FIG. 13c, the solder plating 66 is heated for temporary melting, thereby providing solder bumps 66'.

In the above-described prior art method, the solder plating 66, which is the bump material, is applied to the openings 64a of the resin film 64 by electroplating. As shown in FIG. 12c, the solder plating 66 deposited by electroplating partially rides on the resin film 64, thereby having an overhung configuration. Thus, the solder plating 66 includes overhung portions 66a riding on the resin film 64. Therefore, in the process step described with reference to FIG. 13a, the overhung portions 66a may hinder the proper removal of the resin film 64. Specifically, since part of the resin film 64 is sandwiched between the overhung portions 66a and the conductor film 63 formed on the semiconductor chip 60, the removal of the resin film 64 often becomes insufficient. When the resin film 64 remains, it hinders the etching for removal of the conductor film 63 described with reference to FIG. 13b and the formation of the solder bumps 66 described with reference to FIG. 13c. When the formation of the solder bumps 66' is hindered, the height uniformity of the solder bumps 66' tends to be deteriorated.

Instead of the above-described electroplating which utilizes the resin film 64 having openings 64a as a mask, the solder bumps 66' may be formed by a metal mask printing method. First, in the metal mask printing method, a metal mask, which is formed with a plurality of openings in advance, is prepared. The openings are provided at locations corresponding to the electrode portions of the semiconductor chip. A barrier metal layer is formed at each of the electrode portions in advance by photolithography for example. Then, the metal mask is disposed on the semiconductor chip while positioning the openings of the metal mask correspondingly to the electrode portions of the semiconductor chip. Subsequently, solder paste containing solder powder is applied to the openings of the metal mask by a printing method. Then, after the metal mask is removed from the surface of the semiconductor chip, the solder powder in the solder paste is temporarily melted by heating. As a result, generally spherical solder bumps are formed on the electrode portions of the semiconductor chip. This technology is disclosed in JP-A-11-340270 for example.

However, in the metal mask printing method, when the metal mask is to be disposed on the semiconductor chip, the openings need be positioned correspondingly to the electrode portions. Such positioning becomes more difficult as the arrangement pitch of the electrode portions becomes smaller. Particularly when the arrangement pitch is no more than 200 μm, the positional deviation in disposing the metal mask becomes significantly large. The positional deviation of the metal mask affects the position of the bump formation, which may lead to a conduction failure when the semiconductor chip is flip-chip bonded to a wiring board.

Moreover, in the metal mask printing method, the metal mask need be removed from the semiconductor chip before heating the solder paste. At that time, part of the solder paste is often removed together with the metal mask. Particularly, the smaller the diameter of the electrodes and hence of the openings of the metal mask is, the larger the proportion of the removed amount of the solder paste in the entire solder paste is. Such partial removal of the solder paste makes it difficult to form solder bumps having a proper size, which problem becomes more serious as the diameter of the electrodes decreases for providing a minute wiring pattern.

Further, in the metal mask printing method, the solder paste is subjected to the heating treatment after the metal mask is removed from the semiconductor chip. Therefore, the solder paste on the electrodes is likely to flow during the heating due to the decrease of the viscosity. As a result, one deposit of the solder paste may join with an adjacent deposit of the solder paste. In such a case, short-circuiting occurs between the adjacent solder bumps. Such a problem is more likely to occur, as the arrangement pitch of the electrodes becomes smaller.

In this way, with the metal mask printing method, it is difficult to form bumps highly accurately on a semiconductor chip provided with electrodes arranged at a minute pitch.

In the technique disclosed in JP-A-11-340270 described above, instead of a metal mask, a polyimide mask is used for defining openings for applying the solder paste. However, as described in JP-A-11-340270, the polyimide mask is not removed from the semiconductor chip. When the polyimide mask remains around the solder bumps on the semiconductor chip, an under-filling material cannot be properly loaded between the semiconductor chip and the wiring board in flip-chip bonding the semiconductor chip to the wiring board. Thus, the polyimide mask hinders the loading of the under-filling material between the semiconductor chip and the wiring board. Therefore, it may be difficult to provide reliable connection between the semiconductor chip and the wiring board.

DISCLOSURE OF THE INVENTION

The present invention, which is conceived under these circumstances, relates to a semiconductor device making method which is capable of forming bumps highly accurately at electrode portions arranged at a minute pitch and is capable of providing a semiconductor device which can be connected to a connection object with high reliability.

According to the present invention, there is provided a method of making a semiconductor device, which comprises a resin film forming step for forming a resin film on a semiconductor substrate provided with electrode portions to cover the electrode portions, an opening forming step for forming openings in the resin film at locations corresponding to the electrode portions, a loading step for loading a bump material in the openings, a bump forming step for forming bumps in the openings by heating, and a removing step for removing the resin film.

With such a semiconductor device making method, bumps can be formed highly accurately at electrode portions arranged at a minute pitch.

In the present invention, the openings for loading the bump material may be formed in the resin film by photolithography or UV-YAG laser application, for example. By the photolithography or the UV-YAG laser application, openings can be formed in the resin film at a minute pitch corresponding to the electrodes with positional accuracy. Therefore, the bump material can be applied to each of the electrode portions with high positional accuracy even when the electrodes are arranged at a minute pitch. Thus, according to the present invention, bumps can be formed highly accurately at the electrode portions on the semiconductor substrate.

The resin film of the present invention may be dissolved or swelled, for example, by the use of an appropriate solvent after the bumps are formed. Therefore, the present invention can avoid such a problem as partial removal of the bump material or the solder paste, which may occur in the metal mask printing method in which a metal mask need be removed before bumps are formed.

Further, in the bump forming process accompanying the heating treatment, the bumps are made with the deposits of the bump material separated from each other by the resin film remaining on the semiconductor substrate. Therefore, short-circuiting does not occur between adjacent bumps.

In this way, according to the present invention, it is possible to supply an appropriate amount of bump material to each of the electrode portions positionally accurately and to prevent short-circuiting between adjacent solder bumps. Therefore, solder bumps can be formed highly accurately at electrode portions arranged at a small pitch.

According to the present invention, a semiconductor device is provided which can be connected to a connection object with high connection reliability.

According to the present invention, the resin film provided as a mask for forming bumps is removed. The resin film is removed after the bump material loaded in the openings is heated to provide bumps. Even when the bump material after the loading step has an overhung configuration, the overhung portion tends to disappear due to the surface tension when the bump material is heated to become bumps. Therefore, according to the present invention, the resin film provided for bump formation can reliably be removed. Since the resin film for bump formation does not remain, after the semiconductor chip is mounted to a connection object such as a wiring board, a sealing resin and an under-filling material can properly be loaded between the semiconductor chip and the connection object. Since the sealing resin and the under-filling material protect the connecting portions, high connection reliability is provided between the semiconductor chip and the connection object.

In this way, according to the present invention, it is possible to form bumps highly accurately on electrode portions arranged at a minute pitch and to provide a semiconductor device which can be connected to a connection object with high connection reliability.

In a preferred embodiment, the method of making a semiconductor device of the present invention further comprises the step of forming a barrier metal layer on each of the electrode portions by electroless plating before the resin film forming step. In the opening forming step, the openings are formed in the resin film to expose the barrier metal layers. With this method, it is unnecessary to form a conductor film for providing barrier metal layers by electroplating. Accordingly, it is also unnecessary to etch away the conductor film. Thus, since the formation and the removal of the conductor film for electroplating are unnecessary, the efficiency for manufacturing a semiconductor device is enhanced.

In another preferred embodiment, the method further comprises the step of forming a barrier metal layer on each of the electrode portions by electroless plating after the opening forming step. Also with this method, the formation and the removal of the conductor film for electroplating are unnecessary so that the efficiency for manufacturing a semiconductor device is enhanced. Further, with this method, the resin film for forming openings does not come into contact with the upper surface of the barrier metal layer. Therefore, good electrical connection can be provided between the barrier metal layers and the bumps formed thereon.

Preferably, the barrier metal layer forming step includes the steps of forming a catalyst layer on the electrode portion, forming an electroless nickel plating layer having a composition of Ni—P, Ni—B or Ni—P—B on the catalyst layer, and forming an electroless gold plating layer or an electroless palladium plating layer on the electroless nickel plating layer. In this case, it is preferable that the catalyst layer contains Zn or Pd. With such a method, good barrier metal layers can be formed.

Preferably, the bump material is solder paste containing solder powder containing a metal selected from the group consisting of Sn, Pb, Cu, Ag, In, Zn, Bi, Sb and Au. In this case, the supplying of the solder material may be performed by loading the bump material into the openings using a squeegee. Preferably, the loading with the use of a squeegee may be performed twice or more.

In another preferred embodiment, the method further comprises the steps of forming a conductor film on the semiconductor substrate to cover the electrode portions before the resin film forming step and forming a barrier metal layer on each of the electrode portions by electroplating after the opening forming step. In the loading step, the bump material is deposited onto the barrier metal layer by electroplating.

Preferably, in the present invention, the resin film forming step comprises bonding a film of photosensitive resin material as the resin film to the semiconductor substrate. With this method, it is possible to use a film of resin material having a thickness which has been controlled to be equal to that of a resin film to be formed. Therefore, the thickness control of a resin film to be formed on the semiconductor substrate can be performed easily. Further, a relatively thick resin film can be easily formed as compared with the case where resin material in liquid state is used. To load a sufficient amount of solder paste into the openings formed in the resin film, it is preferable that the resin film has a film thickness of no less than 30 µm. Moreover, when the resin film is photosensitive, the openings can be formed by photolithography. By the photolithography, openings can be formed in the resin film at a minute pitch with positional accuracy.

Preferably, in the removing step, the resin film is removed by using a stripping agent having a pH of 8–13. Further, preferably, the stripping agent contains amine. It is preferable that the stripping agent contains a corrosion inhibitor for preventing the bumps from corroding. Further, preferably, the stripping agent contains a corrosion inhibitor for preventing the barrier metal layers and the electrode portions from corroding. With such a method, the removal of the resin film can be performed reliably.

Preferably, the method further comprises the steps of covering the bumps with a flux or carboxylic acid and heating the bumps for temporary melting. When the bumps are heated for temporary melting while being covered with a flux or carboxylic acid, the configuration of the bumps can be adjusted. This further enhances the accuracy of the bump formation.

BRIEF DESCRIPTION OF THE DRAWINGS

FIGS. 2a–2d illustrate process steps subsequent to the process step shown in FIG. 1d.

BEST MODE FOR CARRYING OUT THE INVENTION

Figure 1A:
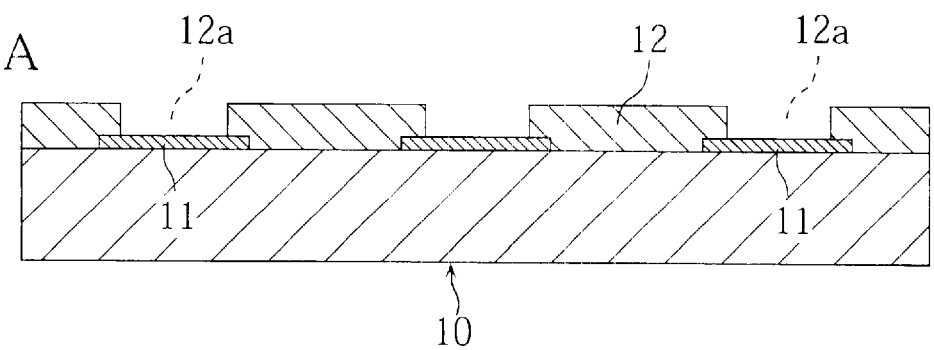
FIGS. 1a–1d illustrate part of process steps for making a semiconductor device according to a first embodiment of the present invention.

FIGS. 1a–3c illustrate a method of making a semiconductor device according to a first embodiment of the present invention. In the first embodiment, a semiconductor substrate 10 as shown in FIG. 1a is first prepared. The semiconductor substrate 10 may be a semiconductor chip or a semiconductor wafer. The semiconductor substrate 10 is formed with a plurality of electrode portions 11 and a protective film 12 in advance. The electrode portions 11 are part of a wiring pattern (not shown) formed on the obverse surface of the substrate and are spaced from each other at a predetermined pitch. The wiring pattern and the electrode portions 11 are made of Al or Cu for example. The protective film 12, which functions to protect the wiring pattern or the like on the substrate, is formed of polyimide, $SiO_2$ or $Si_3N_4$, for example. The protective film 12 includes openings 12a at locations corresponding to the electrode portions 11.

Figure 1B:
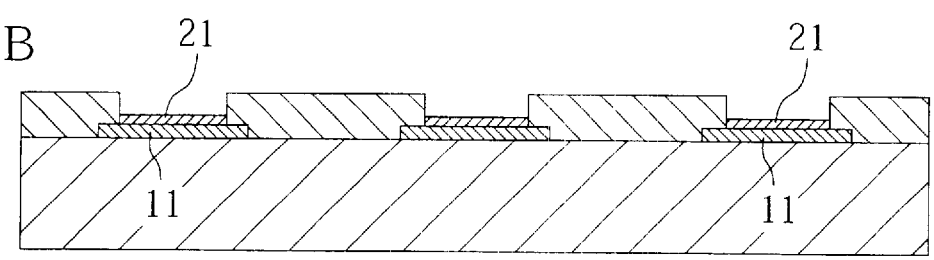
Figure 1C:
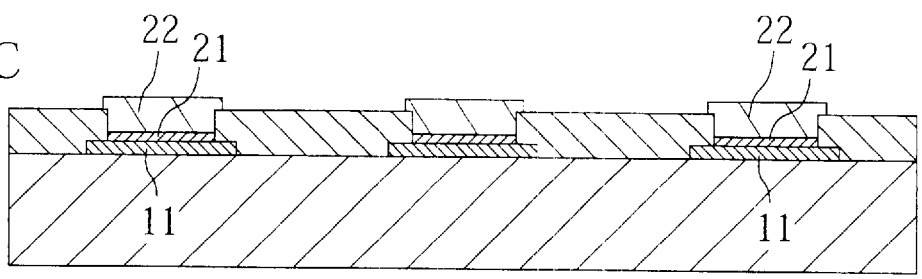
Figure 1D:
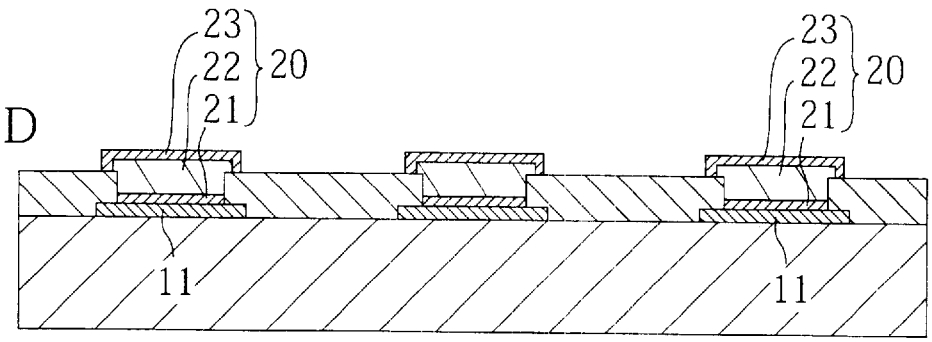

In this embodiment, a barrier metal layer 20 as shown in FIG. 1d is formed on each of the electrode portions 11 of the semiconductor substrate 10. For forming the barrier metal layer 20, a catalyst layer 21 is first formed on the electrode portion 11, as shown in FIG. 1b. The catalyst layer 21 may be formed by immersing the semiconductor substrate 10 in a treatment liquid in which a catalyst metal such as zinc (Zn) or palladium (Pd.) is dissolved.

Subsequently, as shown in FIG. 1c, a nickel layer 22 is formed on each of the catalyst layers 21 by electroless plating. The nickel layer 22 may be formed by immersing the semiconductor substrate 10 in an electroless plating solution in which nickel (Ni) as well as phosphorus (P) and boron (B) are dissolved. To satisfactorily prevent the diffusion of a solder component, it is preferable that the nickel layer 22 has a thickness of no less than 2 µm.

In this embodiment, the nickel layer 22 partially rides on the protective film 12, thereby having an overhung configuration. However, the present invention is not limited thereto, and the immersion time may be controlled so that the nickel layer 22 does not ride on the protective film 12.

In this embodiment, the catalyst layer 21 is formed to be thick enough to remain after the formation of the nickel layer 22. However, the present invention is not limited thereto, and the catalyst layer 21 may have such a thickness that the catalyst layer 21 significantly reduces in size or disappears due to the formation of the nickel layer 22. For example, when the catalyst layer 21 is formed of Zn, the incipient reaction in developing the nickel layer 22 is the substitution of the depositing material for Zn. Therefore, depending on the thickness of the catalyst layer 21, the catalyst layer 21 may substantially disappear due to the formation of the nickel layer 22.

Subsequently, as shown in FIG. 1d, a protective layer 23 is formed on each of the nickel layers 22 by electroless plating. The protective layer 23 may be a gold-plating layer or a palladium-plating layer formed by immersing the semiconductor substrate 10 in an electroless plating solution in which gold (Au) or palladium (Pd) is dissolved. The protective layer 23 functions to protect the nickel layer 22 and to enhance the wettability of the solder component for the barrier metal layer 20. In this way, the barrier metal layers 20 each comprising a catalyst layer 21, a nickel layer 22 and a protective layer 23 are formed.

Then, as shown in FIG. 2a, a resin film 30 is provided to cover the electrode portions 11 formed with the barrier metal layers 20. The resin film 30 may be provided by bonding a dry film of a photosensitive and insulating resin material to the semiconductor substrate 10 under pressure. Then, as shown in FIG. 2b, openings 30a are formed in the resin film 30 by photolithography. Specifically, the openings 30a are formed by subjecting the portions of the resin film 30 corresponding to the electrode portions 11 to a light-exposure process and the subsequent developing process.

Subsequently, as shown in FIG. 2c, solder paste 40 is loaded in the openings 30a. In loading the solder paste 40, it is desirable that a large amount of excess solder paste does not remain on the upper surface of the resin film. For this purpose, it is advantageous that the excess of solder paste adhering to the upper surface of the resin film 30 is scraped off using a squeegee (not shown) for example. For the squeegee, use may be made of a relatively soft urethane rubber squeegee for alleviating the damage to the resin film 30. For reliably loading a predetermined amount of solder paste 40 in the openings 30a, it is preferable that the squeegeeing is performed twice or more.

The solder paste 40 may be a mixture of solder powder with a flux consisting of rosin, a solvent and an activator for example. For the solder component constituting the solder powder, use may be made of a mono-elemental metal selected from the group consisting of Sn, Pb, Cu, Ag, In, Zn, Bi, Sb and Au for example or an alloy of plural kinds of metal elements selected from the group. Since the solder paste 40 need be loaded in minute openings 30a, it is preferable that the solder powder contained in the solder paste 40 has a relatively small particle size. Preferably, the solder powder has an average particle size of no more than 20 $\mu$m. However, when the average particle size of the solder particles is excessively small, the surface area of the solder per unit volume of the solder paste becomes excessively large. When the surface area of the solder is excessively large, a large amount of activator, which will be described later, need be used. Therefore, to control the amount of the activator in the paste to an acceptable range, it is preferable that the average particle size of the solder powder is no less than 5 $\mu$m.

For the rosin, use may be made of polymerized rosin, hydrogenated rosin or esterified rosin, for example.

For the solvent, use may be made of diethylene glycol monobutyl ether, ethylene glycol monophenyl ether, 2-methyl-2,4-pentanediol, 2-methyl-1,3-hexanediol, for example.

For the activator, use maybe made of carboxylic acid and/or organic amine. Since carboxylic acid contains a carboxyl group in the molecular structure, the carboxylic acid in the solder paste functions to remove an oxide film formed on the surfaces of the solder particles and the surfaces of the electrode portions. Since organic amine contains an amino group in the molecular structure, the organic amine in the solder paste functions to remove an oxide film formed on the surfaces of the solder particles and the surfaces of the electrode portions. In this embodiment, use may be made of one or more carboxylic acid and/or organic amine selected from the group consisting of sebacic acid, succinic acid, adipic acid, glutaric acid, triethanolamine, monoethanolamine and tributylamine, for example. To fully enjoy the action of the activator, it is preferable to use an activator which decomposes or evaporates at a temperature close to the melting point of the solder. Further, to exhibit the capability of removing an oxide film to the maximum, the activator need be uniformly dispersed in the solder paste. For this purpose, an activator having compatibility with the solvent or rosin may preferably be used.

To provide the solder paste with shape-holding ability, a thixotropic agent may further be added to the flux. Examples of the thixotropic agent include hardened caster oil and amide hydroxystearate.

In the semiconductor device making method of this embodiment, after the solder paste 40 is loaded in the openings 30a, heating is performed to melt the solder powder contained in the solder paste 40. By the heating, the ingredients of the solder paste other than the solder component i.e. the solvent and the like vaporize for dissipation, while the solder component integrates or collects to provide a spherical shape due to the surface tension, as shown in FIG. 2d. The solder paste is then cooled for solidification. In this way, solder bumps 41 fixed to the electrode portions 11 via the barrier metal layers 20 are formed.

Figure 3A:
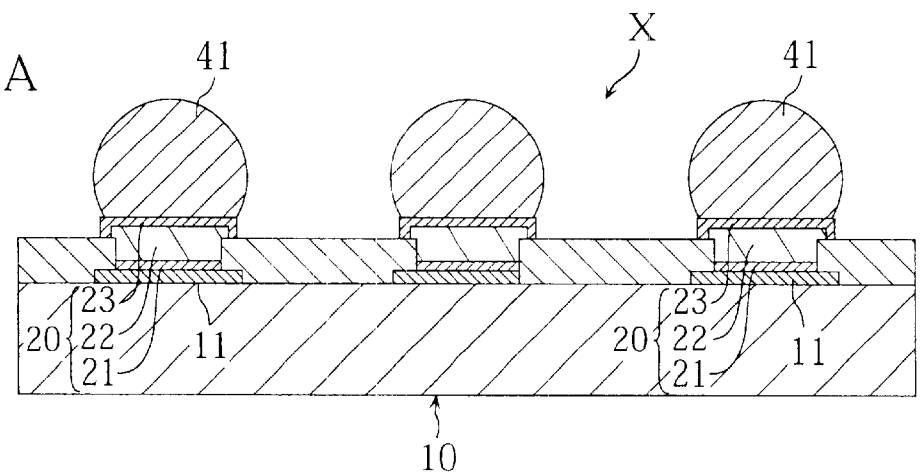
FIGS. 3a–3c illustrate process steps subsequent to the process step shown in FIG. 2d.

After the solder bumps 41 are formed, the resin film 30 is removed from the surface of the semiconductor substrate 10, as shown in FIG. 3a. In this way, there is provided a semiconductor device X provided with plural solder bumps 41 as the terminals for external connection. The resin film 30 may be removed with a stripping agent such as alkaline solution. Examples of alkaline solution include an aqueous solution of monoethanolamine and an aqueous solution of triethanolamine.

In the case where a stripping agent composed of alkaline solution is used, it is more preferable to use a stripping agent containing a corrosion inhibitor for preventing the corrosion of the solder bumps 41. Examples of the corrosion inhibitor include sugar alcohol such as xylitol, sodium vanadate and sodium molybdate. When an alkaline stripping agent which does not contain a corrosion inhibitor is used, the surfaces of the bumps are likely to corrode due to the stripping agent. For example, when the solder bumps 41 are formed of Sn—Pb eutectic solder and the resin film 30 is removed with an alkaline stripping agent which does not contain a corrosion inhibitor, Sn constituting the solder bumps 41 is selectively etched. As a result, a Pb layer having a high melting point develops on the surfaces of the bumps. When such a Pb layer is formed on the bump surfaces, the solder bumps 41 need be heated to a temperature equal to or higher than the melting point of Pb for entirely re-melting the solder bumps.

Further, for the stripping agent, use may preferably be made of a stripping agent containing a corrosion inhibitor for preventing the corrosion of the electrode portions 11 and the barrier metal layers 20. In the process step of forming a catalyst layer for electroless plating described with reference to FIG. 1b, the catalyst layer 21 is formed only on each of the electrode portions 11, not on the protective film 12. In the electroless plating, the plating metal is deposited only at the portion formed with the catalyst layer 21. Therefore, the nickel layer 22 and the protective layer 23 are formed on the electrode portion 11 formed with the catalyst layer 21, not on the surface of the protective film 12. Therefore, a small gap is likely to be formed between the barrier metal 20 and the protective film 12. When such a gap exists, the alkaline stripping agent for the resin film removal may enter the gap to reach the electrode portion 11. In the case where the alkaline stripping agent does not contain a corrosion inhibitor, the stripping agent may corrode the electrode portion 11. Further, when the alkaline stripping agent corrodes the barrier metal layer 20, the gap between the barrier metal 20 and the protective film 12 tends to enlarge, which increases the corrosion of the electrode portion 11. To prevent or alleviate such corrosion of the barrier metal layer 20 and the electrode portion 11, it is preferable that a corrosion inhibitor capable of preventing such corrosion is added to the alkaline stripping agent. For the corrosion inhibitor, use may be made of those described before as the corrosion inhibitor for the solder bumps 41.

Figure 3B:
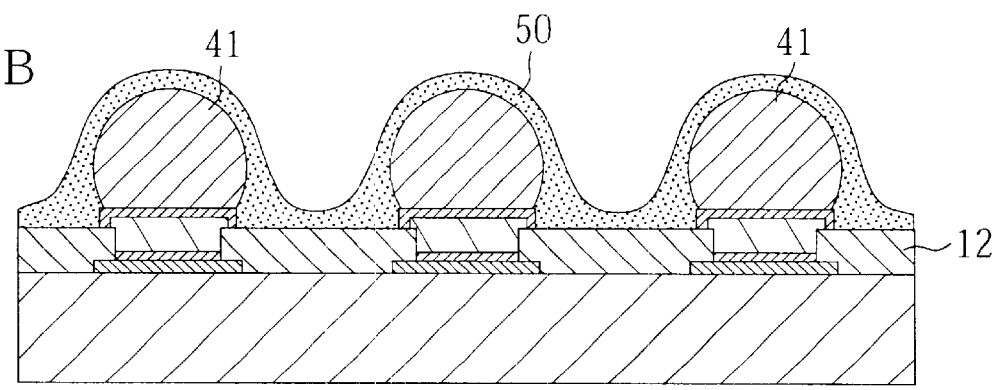

Subsequently, for the semiconductor device X, the configuration of the solder bumps 41 is preferably adjusted. To adjust the configuration of the solder bumps 41, flux 50 is first applied to cover the surfaces of the solder bumps 41, as shown in FIG. 3b. For the flux, use may be made of one that contains rosin, a solvent and an activator similarly to the flux contained in the solder paste 40 and that has is capable of removing an oxide film. According to the present invention, instead of the flux 50, an aqueous solution of carboxylic acid, such as formic acid, which does not contain a solid matter such as rosin may be sprayed to the bump surfaces. With this method, since the aqueous solution does not contain a solid matter, the residue after the heating process can be decreased considerably.

Figure 3C:
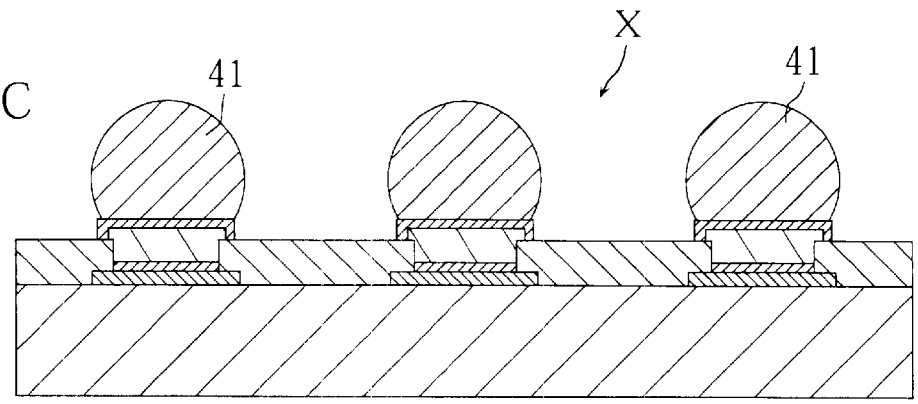

Subsequently, as shown in FIG. 3c, the heating process is performed to re-melt the solder bumps 41. By the re-melting, the configuration of the solder bumps 41 can be adjusted to a good one.

Figure 4A:
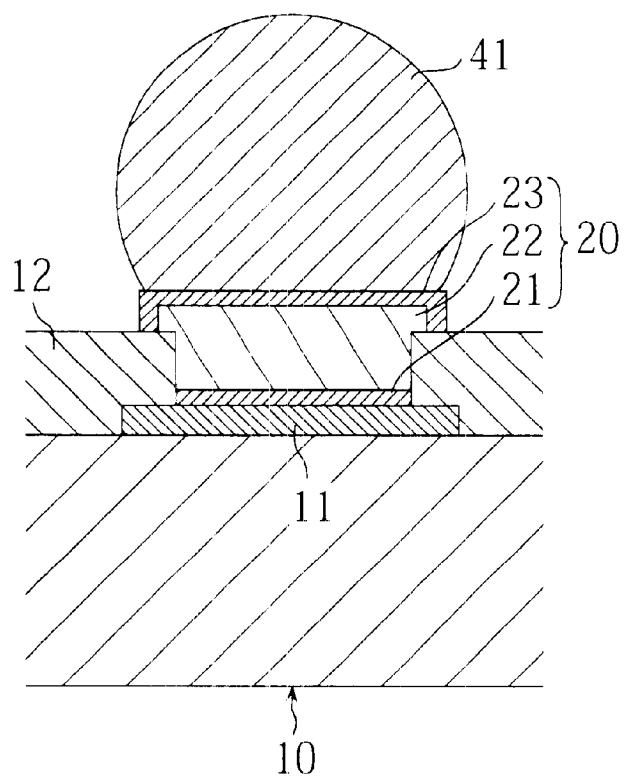
FIGS. 4a and 4b are enlarged views illustrating part of a semiconductor device obtained by a semiconductor device making method according to the present invention.
Figure 4B:
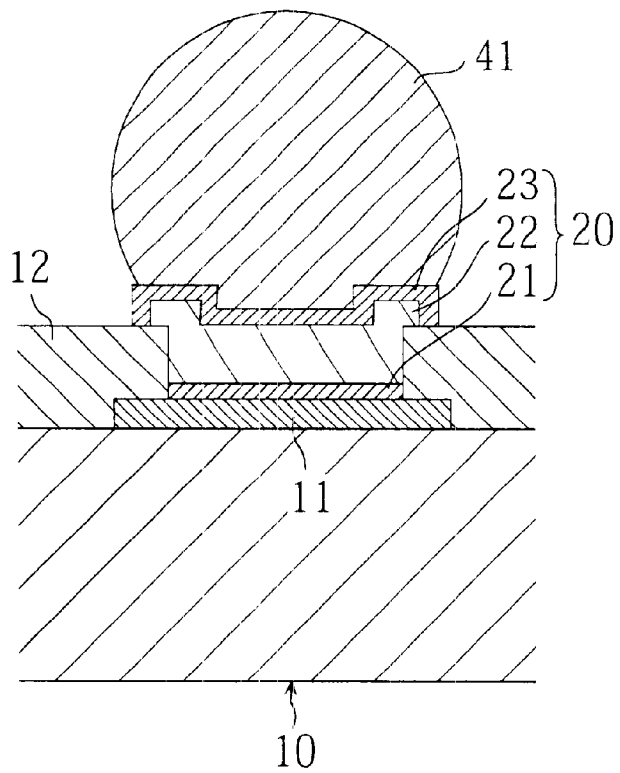

FIG. 4a is an enlarged view of a portion shown in FIG. 3c. According to the present invention, as clearly shown in FIG. 4a, the solder bump 41 is provided on the electrode portion 11 of the semiconductor substrate 10 via the barrier metal layer 20. The barrier metal layer 20 has a lamination structure consisting of the catalyst layer 21, the nickel layer 22 and the protective layer 23. In the present invention, the upper surface of the barrier metal layer 20 formed by electroless plating may be partially retreated, as shown in FIG. 4b.

In the semiconductor device making method of this embodiment, photolithography is utilized to form the openings 30a in the resin film 30. By the photolithography, the openings 30a can be so formed in the resin film 30 as to positionally correspond to the electrode portions 11 of the semiconductor device 10 with high accuracy even when the electrode portions 11 are arranged at a minute pitch of no more than 200 µm, for example. Accordingly, the solder paste 40 as the bump material can be applied accurately even to the electrode portions 11 arranged at a minute pitch. Therefore, according to this embodiment, the solder bumps 41 are formed positionally accurately at the electrode portions 11 of the semiconductor substrate 10. Further, the resin film 30 is dissolved with the use of an appropriate solvent for removal after the solder bumps 41 are formed. Therefore, it is possible to avoid such a problem as partial removal of the bump material or the solder paste, which may occur in the metal mask printing method in which a metal mask is removed before bumps are formed. Moreover, in the bump forming process accompanying heating described with reference to FIG. 2d, the solder bumps 41 are made with the resin film 30 separating the deposits of the solder paste 40 from each other remained on the semiconductor substrate 10. Therefore, short-circuiting between adjacent solder bumps 41 does not occur.

In this way, it is possible, in this embodiment, to apply an appropriate amount of solder paste 40 to each of the electrode portions 11 positionally accurately and to prevent short-circuiting between adjacent solder bumps 41. Thus, solder bumps 41 can be formed highly accurately at electrode portions 11 arranged at a small pitch.

In the semiconductor device making method of this embodiment, the resin film 30 formed on the semiconductor substrate 10 as a mask for forming bumps is removed after the solder paste 40 loaded in the openings 30a is heated to become the solder bumps 41. The solder bumps 41 are smaller in diameter than the openings 30a. Therefore, the solder bumps 41 do not hinder the proper removal of the resin film 30. Since the resin film 30 is properly removed, reliable connection can be provided between the semiconductor device X and a connection object such as a wiring board.

Figure 5:
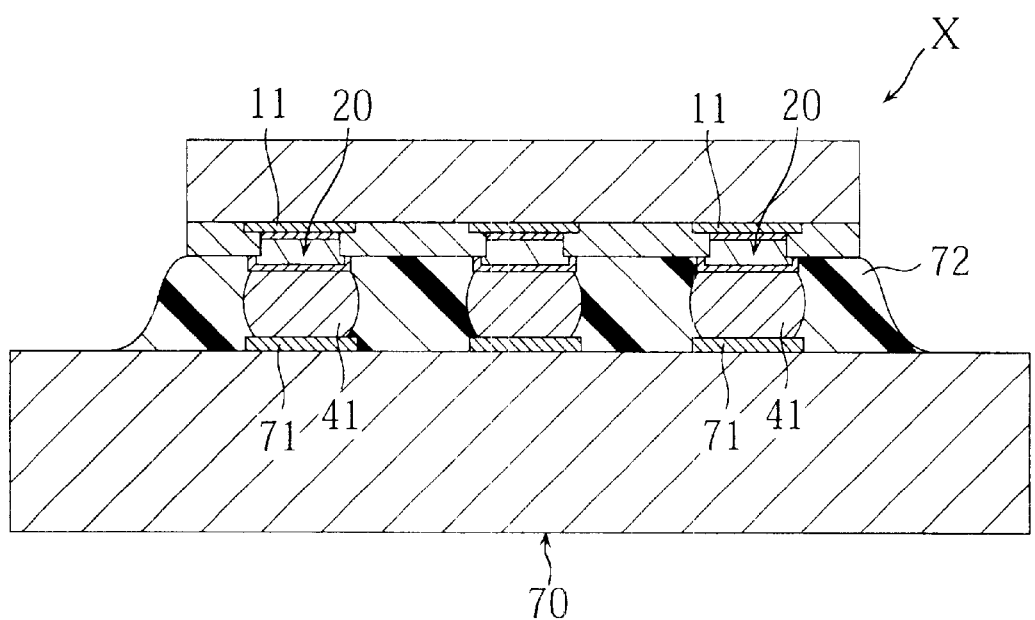
FIG. 5 illustrates a semiconductor device obtained by a semiconductor device making method according to the present invention as mounted to a wiring board by flip-chip bonding.

FIG. 5 illustrates the semiconductor device X flip-chip bonded to a wiring board 70. The wiring board 70 is formed with a plurality of electrode portions 71 in advance. The electrode portions 71 are provided at locations corresponding to the solder bumps 41 of the semiconductor device X. The solder bumps 41 are melted and bonded to the electrode portions 71. An under-filling material 72 is loaded between the semiconductor device X and the wiring board 70. Since the resin film 30 for bump formation does not remain on the semiconductor device X, the under-filling material 72 can be properly loaded between the semiconductor device X and the wiring board 70 bonded together via the solder bumps 41. The under-filling material 72 protects electrically connected portions, which consist of the barrier metal layers 20 on the electrode portions 11, the solder bumps 41 and the electrode portions 71, as well as the bonded surfaces of the semiconductor device X and the wiring board 70. As a result, reliable connection is provided between the semiconductor device X and the wiring board 70.

Figure 6A:
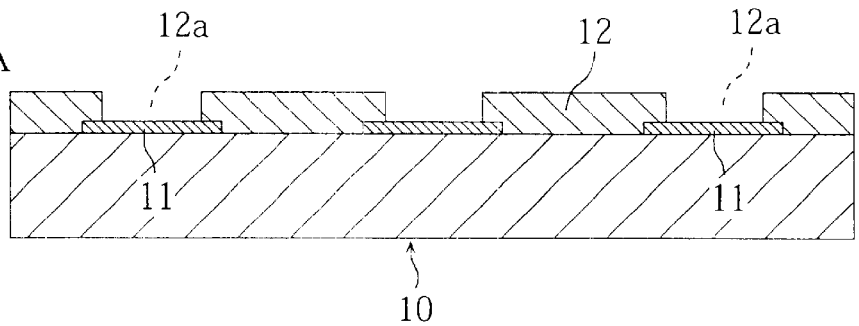
FIGS. 6a–6d illustrate part of process steps for making a semiconductor device according to a second embodiment of the present invention.

FIGS. 6a–7c illustrate a method of making a semiconductor device according to a second embodiment of the present invention. In the second embodiment, a semiconductor substrate 10 as shown in FIG. 6a is first prepared. The semiconductor substrate 10 is formed with a plurality of electrode portions 11 and a protective film 12 in advance. Other structural features of the semiconductor substrate 10 as well as of the electrode portions 11 and the protective film 12 are similar to those described as to the first embodiment.

Figure 6B:
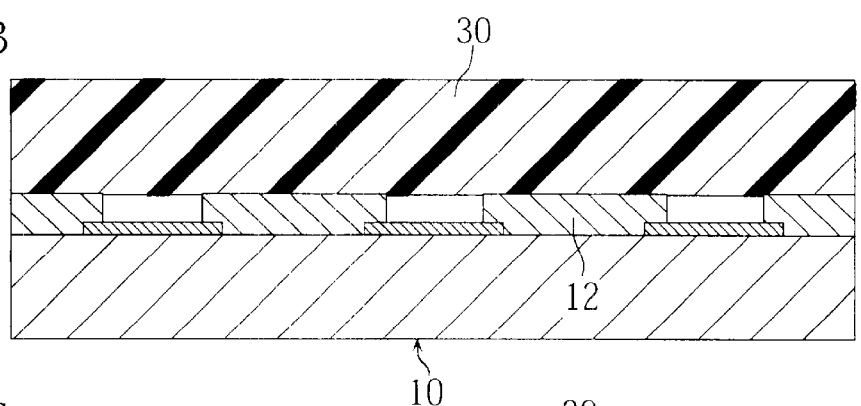
Figure 6C:
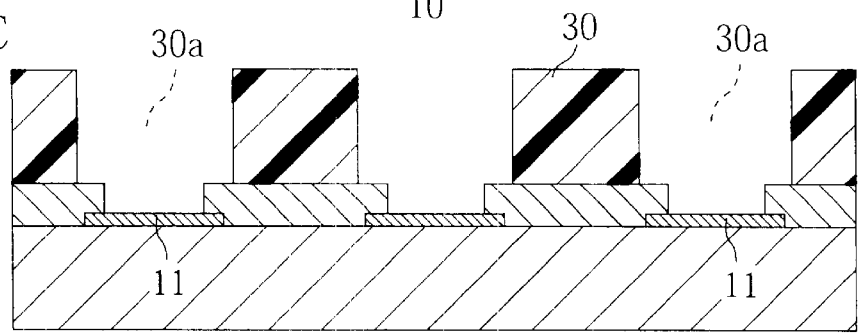

In this embodiment, as shown in FIG. 6b, a resin film 30 is formed on the protective film 12 of the semiconductor substrate 10. The resin film 30 may be provided by bonding a dry film of a photosensitive and insulating resin material to the semiconductor substrate 10 under pressure. Then, as shown in FIG. 6c, openings 30a are formed in the resin film 30 by photolithography. Specifically, the openings 30a are formed by subjecting the portions of the resin film 30 corresponding to the electrode portions 11 to a light-exposure process and the subsequent developing process.

Figure 6D:
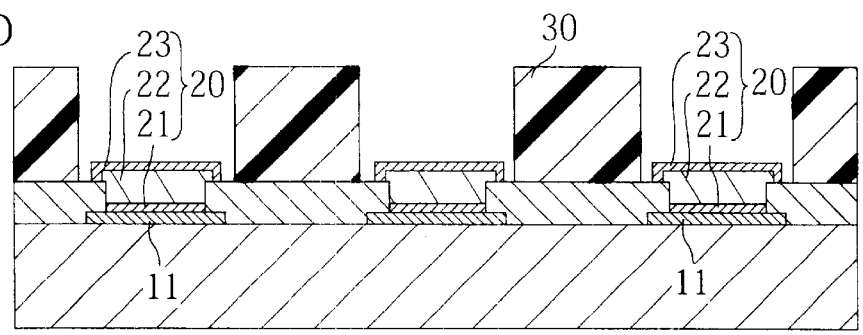

Subsequently, as shown in FIG. 6d, a barrier metal layer 20 comprising a catalyst layer 21, a nickel layer 22 and a protective layer 23 is formed on each of the electrode portions 11. The barrier metal layer 20 may be formed in a manner similar to that described as to the first embodiment with reference to FIGS. 1b–1d.

Figure 7A:
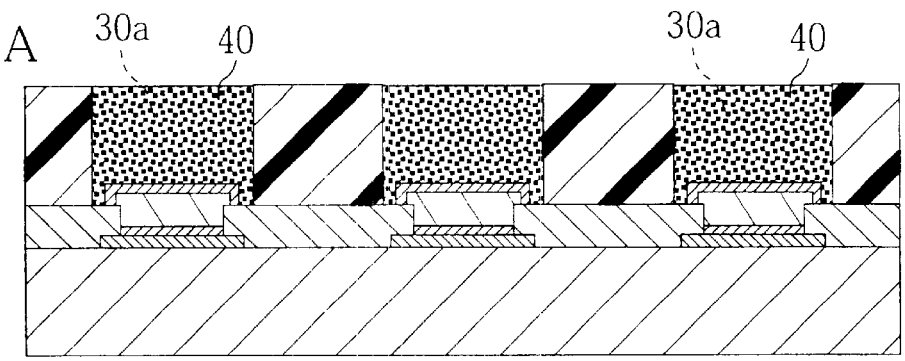
FIGS. 7a–7c illustrate process steps subsequent to the process step shown in FIG. 6d.

Then, as shown in FIG. 7a, solder paste 40 is loaded in the openings 30a. The composition of the solder paste 40 and the manner of loading are similar to those described as to the first embodiment.

Figure 7B:
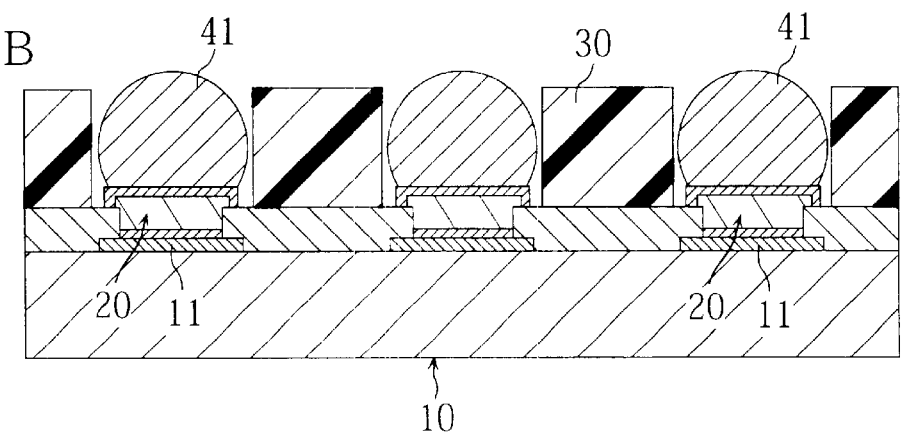

Subsequently, heating is performed to melt the solder powder contained in the solder paste 40. By the heating, the ingredients of the solder paste other than the solder component i.e. the solvent and the like vaporize for dissipation, while the solder component integrates or collects to provide a spherical shape due to the surface tension, as shown in FIG. 7b. The solder paste is then cooled for solidification. In this way, solder bumps 41 fixed to the electrode portions 11 via the barrier metal layers 20 are formed.

Figure 7C:
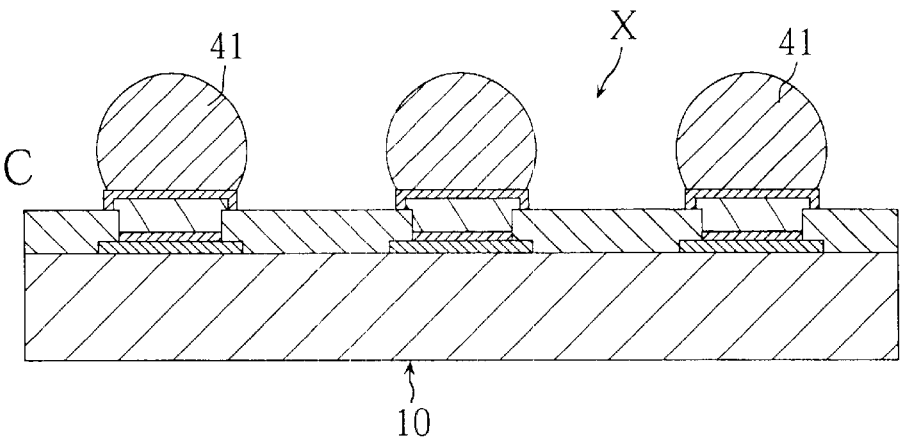

Then, as shown in FIG. 7c, the resin film 30 is removed from the surface of the semiconductor substrate 10. The resin film 30 may be removed with the use of a stripping agent such as alkaline solution. Details of the stripping agent are as described with respect to the first embodiment. In this way, there is provided a semiconductor device X provided with plural solder bumps 41 as terminals for external connection. The configuration of the solder bumps 41 of the semiconductor device X may be adjusted through the process steps described as to the first embodiment with reference to FIGS. 3b and 3c.

In the semiconductor device making method of this embodiment, the openings 30a are formed in the resin film 30 positionally accurately by photolithography. Therefore, the solder paste 40 as the bump material can be supplied accurately even to the electrode portions 11 arranged at a minute pitch. Further, the resin film 30 is dissolved with the use of an appropriate solvent for removal after the solder bumps 41 are formed. Therefore, it is possible to avoid such a problem as partial removal of the bump material or the solder paste, which may occur in the metal mask printing method in which a metal mask is removed before bumps are formed. Moreover, in the bump forming process accompanying heating, the solder bumps 41 are made with the resin film 30 separating the deposits of the solder paste 40 from each other remained on the semiconductor substrate 10. Therefore, short-circuiting does not occur between adjacent solder bumps 41.

In this way, it is possible, in this embodiment, to supply an appropriate amount of solder paste 40 to each of the electrode portions 11 positionally accurately and to prevent short-circuiting between adjacent solder bumps 41. Therefore, solder bumps 41 can be formed highly accurately at electrode portions 11 arranged at a small pitch.

In the semiconductor device making method of this embodiment, the resin film 30 formed on the semiconductor substrate 10 as a mask for forming bumps is removed after the solder paste 40 loaded in the openings 30a is heated to become the solder bumps 41. The solder bumps 41 are smaller in diameter than the openings 30a. Therefore, the solder bumps 41 do not hinder the proper removal of the resin film 30. Since the resin film 30 is properly removed, when the semiconductor device X is flip-chip bonded to the wiring board 70 as shown in FIG. 5, the under-filling material 72 can be properly loaded between the semiconductor device X and the wiring board 70. As a result, reliable connection can be provided between the semiconductor device X and the wiring board 70.

Further, in this embodiment, good electrical connection is provided at the interface of the electrode portion 11 and the barrier metal layer 20 and at the interface of the barrier metal layer 20 and the solder bump 41. In this embodiment, as described with reference to FIG. 6b, the resin film 30 is formed by bonding a dry film of resin material to the protective film 12. At that time, the resin film 30 does not contact the electrode portions 11. Therefore, in a series of process steps of this embodiment, exposed surfaces of the electrode portions 11 are not contaminated by the resin film 30. Further, the barrier metal layer 20 is formed on the electrode portion 11 without contacting the resin film 30, and the solder bump 41 is formed on such a barrier metal layer 20. Therefore, the upper surface of the barrier metal layer 20 is not contaminated due to its contact with the resin film 30, for example. Thus, in this embodiment, the resin film 30, which is organic matter, does not remain at the interface of the electrode portion 11 and the barrier metal layer 20 nor at the interface of the barrier metal layer 20 and the solder bump 41. This is a reason why good electrical connection is provided between the electrode portion 11, the barrier metal layer 20 and the solder bump 41.

Figure 8A:
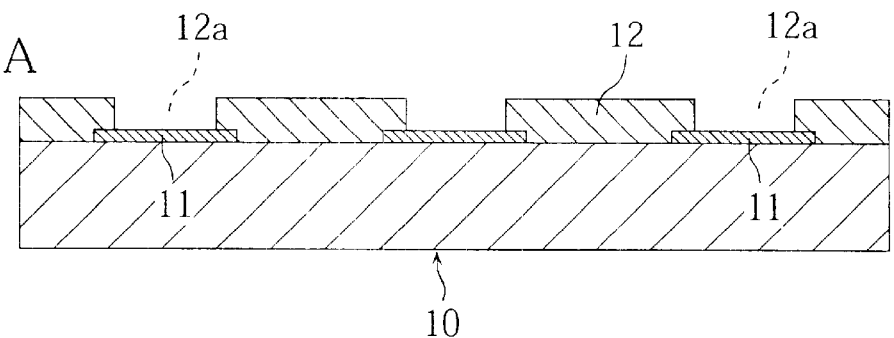
FIGS. 8a–8c illustrate part of process steps for making a semiconductor device according to a third embodiment of the present invention.

FIGS. 8a–10d illustrate a method of making a semiconductor device according to a third embodiment of the present invention. In the third embodiment, a semiconductor substrate 10 as shown in FIG. 8a is first prepared. The semiconductor substrate 10 is formed with a plurality of electrode portions 11 and a protective film 12 in advance. Other structural features of the semiconductor substrate 10 as well as of the electrode portions 11 and the protective film 12 are similar to those described as to the first embodiment.

Figure 8B:
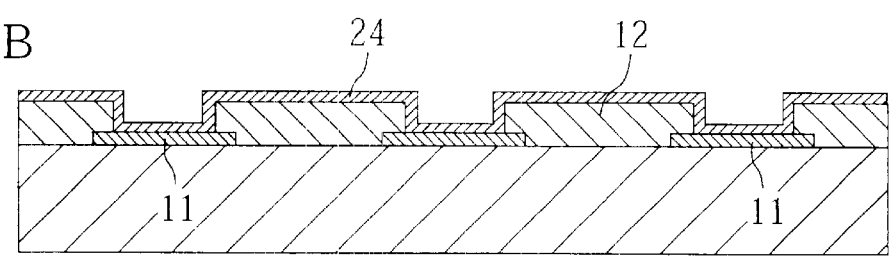
Figure 8C:
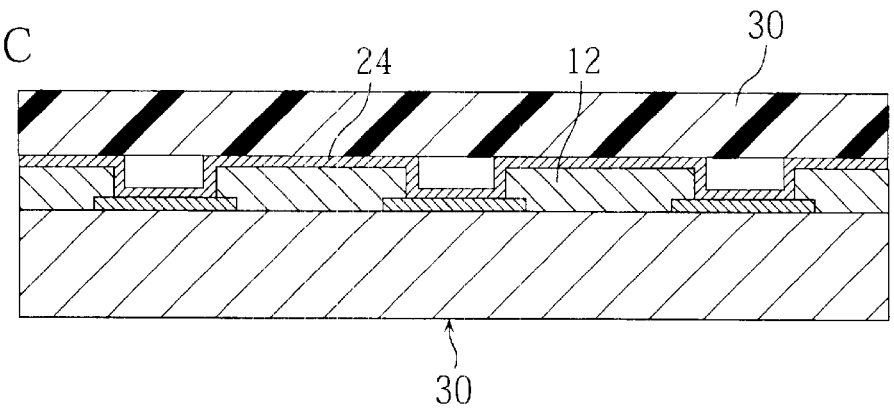

In this embodiment, as shown in FIG. 8b, a conductor film 24 is formed on the protective film 12 of the semiconductor substrate 10. The conductor film 24 may be formed by applying Ti, Ni or Cu by sputtering or vapor deposition to cover the surfaces of the electrode portions 11 and the protective film 12. Then, as shown in FIG. 8c, a resin film 30 is laminated on the semiconductor substrate 10. The resin film 30 may be provided by bonding a dry film of a photosensitive and insulating resin material to the semiconductor substrate 10 under pressure.

Figure 9A:
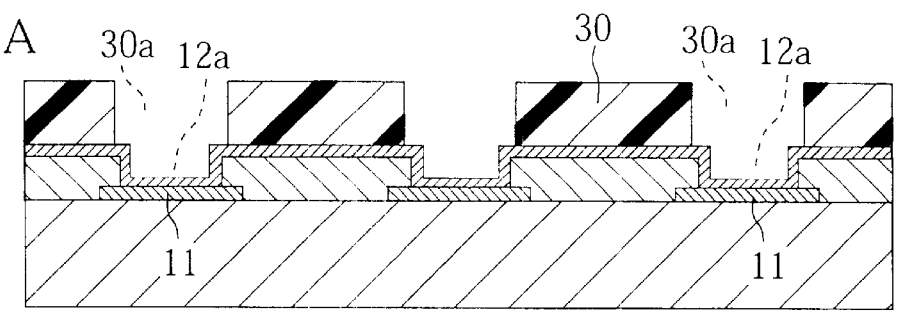
FIGS. 9a–9c illustrate process steps subsequent to the process step shown in FIG. 8c.

Then, as shown in FIG. 9a, openings 30a are formed in the resin film 30 by photolithography. Specifically, the openings 30a are formed by subjecting the portions of the resin film 30 corresponding to the electrode portions 11 to a light-exposure process and the subsequent developing process.

Figure 9B:
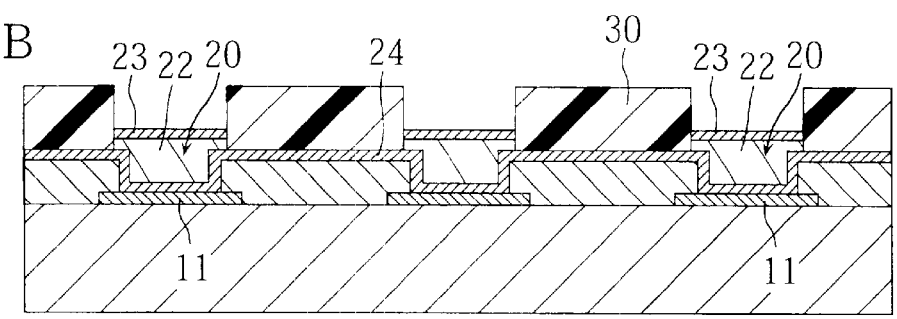

Subsequently, as shown in FIG. 9b, a barrier metal layer 20 is formed on each of the electrode portions 11 by electroplating. For forming the barrier metal layer 20, the semiconductor substrate 10 is first immersed in an electrolyte in which nickel is dissolved for providing the conductor film 24 with a predetermined potential. As a result, a nickel layer 22 develops at the opening 12a and the opening 30a. For the electrolyte, use may be made of Watts bath mainly containing nickel sulfate or nickel chloride. To satisfactorily prevent the diffusion of a solder component, it is preferable that the nickel layer 22 has a thickness of no less than 2 $\mu$m. In this embodiment, the nickel layer 22 partially rides on the protective film 12, thereby having an overhung configuration. However, the present invention is not limited thereto, and the electrolysis time may be controlled so that the nickel layer 22 does not ride on the protective film 12. Subsequently, in this embodiment, to enhance the wettability for the solder of the nickel layer 22, the semiconductor substrate 10 is immersed in an electroplating solution in which gold (Au) or palladium (Pd) is dissolved, thereby forming a protective layer 23 as a gold-plating layer or a palladium-plating layer on the nickel layer 22. In this embodiment, the protective layer 23 may not be formed when the nickel layer 22 formed by electroplating exhibits sufficient solder wettability.

Figure 9C:
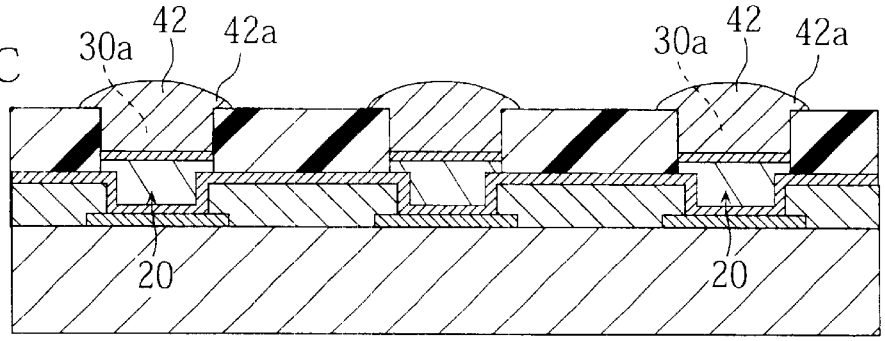

Then, as shown in FIG. 9c, solder plating 42 as a bump material is supplied to the openings 30a by electroplating. Specifically, the semiconductor substrate 10 is immersed in an electrolyte in which the solder material is dissolved for providing the conductor film 24 with a predetermined potential. As a result, the solder plating 42 is deposited on the barrier metal layers 20. At that time, when a sufficient amount of plating material is deposited, the solder plating 42 partially rides on the resin film 30, thereby providing overhung portions 42a.

Figure 10A:
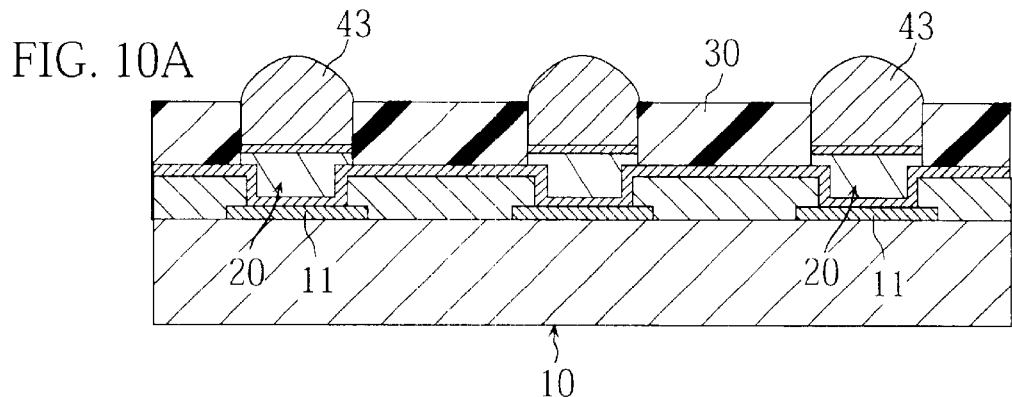
FIGS. 10a–10d illustrate process steps subsequent to the process step shown in FIG. 9c.

Subsequently, as shown in FIG. 10a, heating is performed to once melt the solder plating 42, thereby providing solder bumps 43. At that time, due to the surface tension of the solder material in a molten state, the overhung portions 42a disappear. In this way, solder bumps 43 fixed to the electrode portions 11 via the barrier metal layers 20 are formed.

Figure 10B:
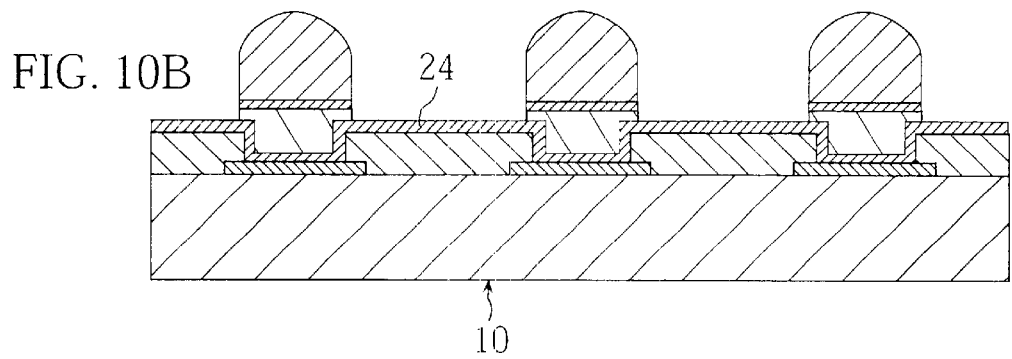
Figure 10C:
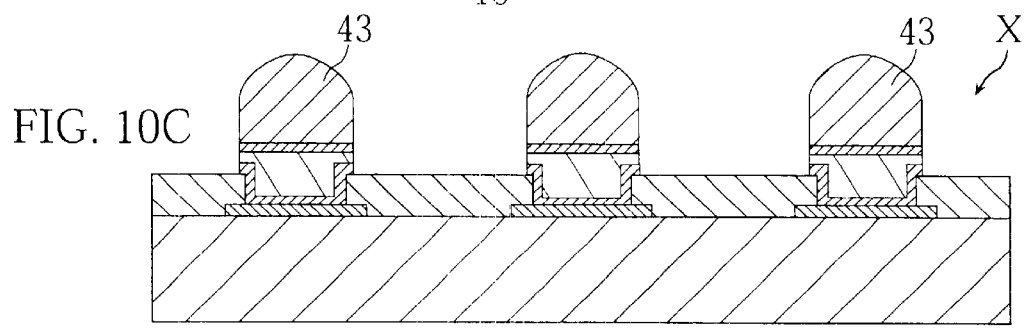
Figure 10D:
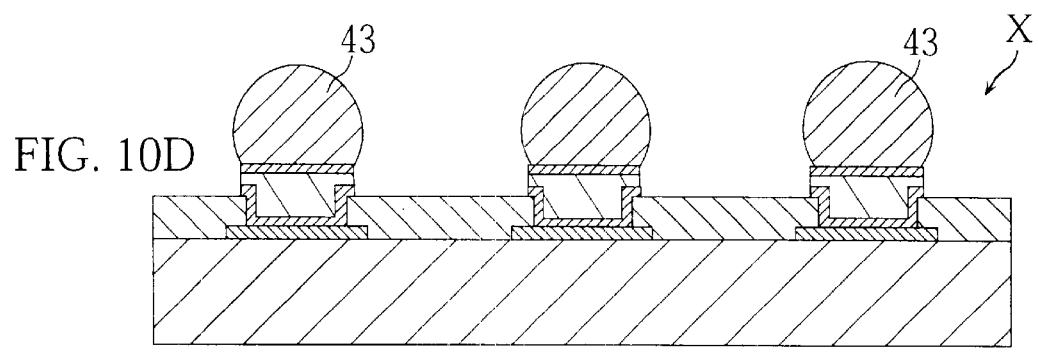
Figure 11A:
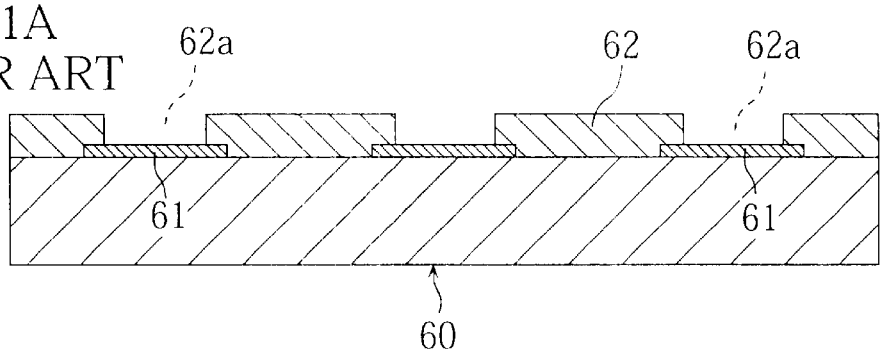
FIGS. 11a–11c illustrate an example of prior art method for making a semiconductor device provided with bump electrodes.
Figure 11B:
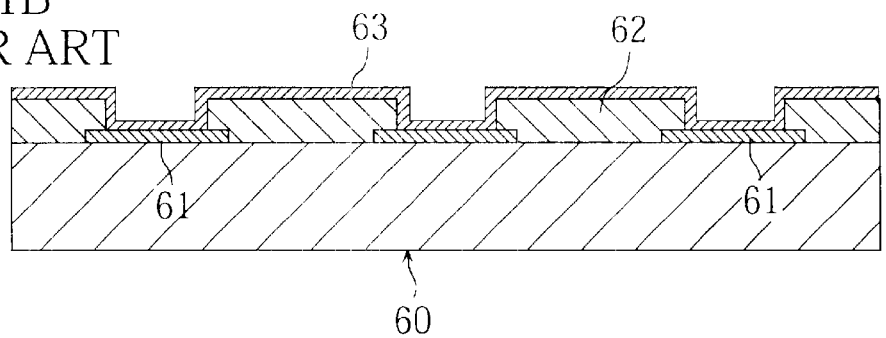
Figure 11C:
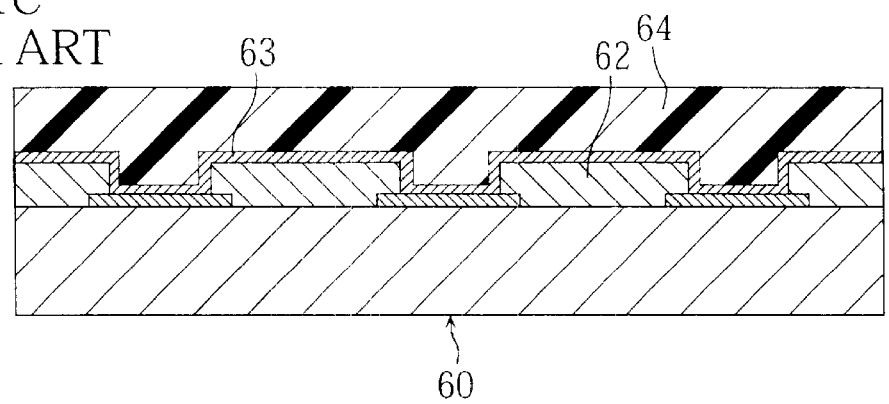
Figure 12A:
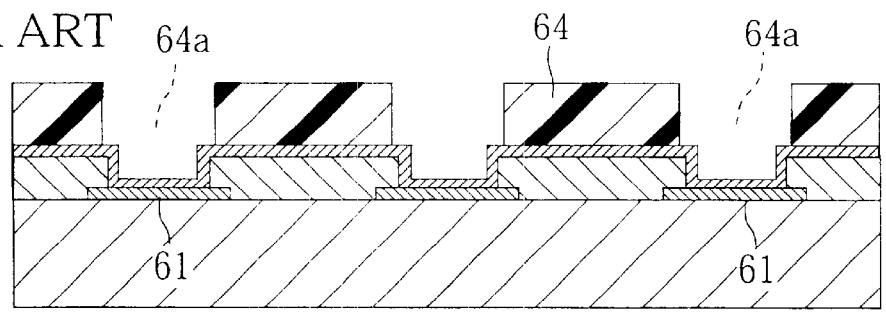
FIGS. 12a–12c illustrate process steps subsequent to the process step shown in FIG. 11c.
Figure 12B:
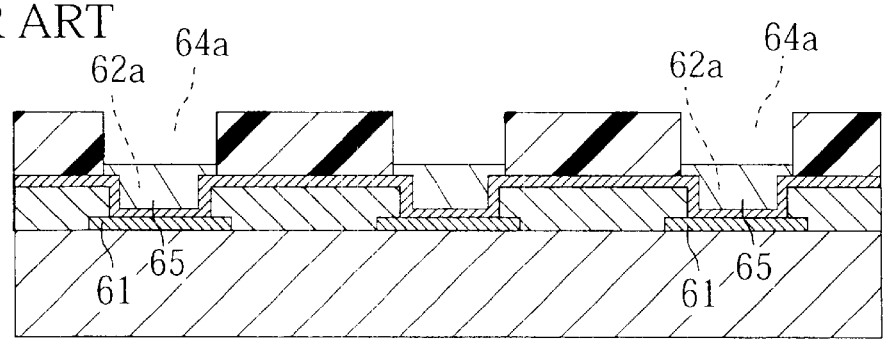
Figure 12C:
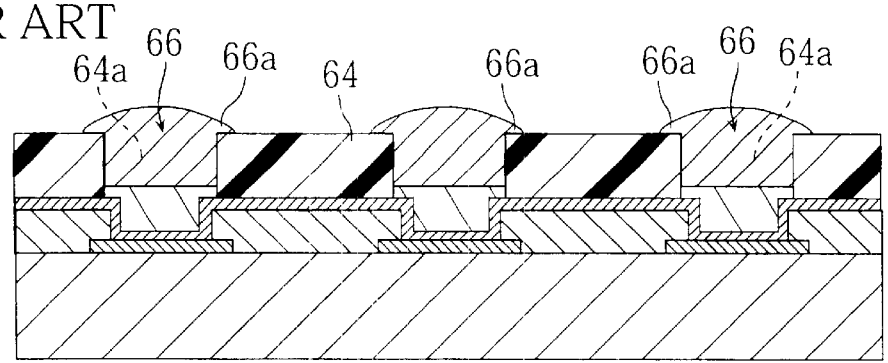
Figure 13A:
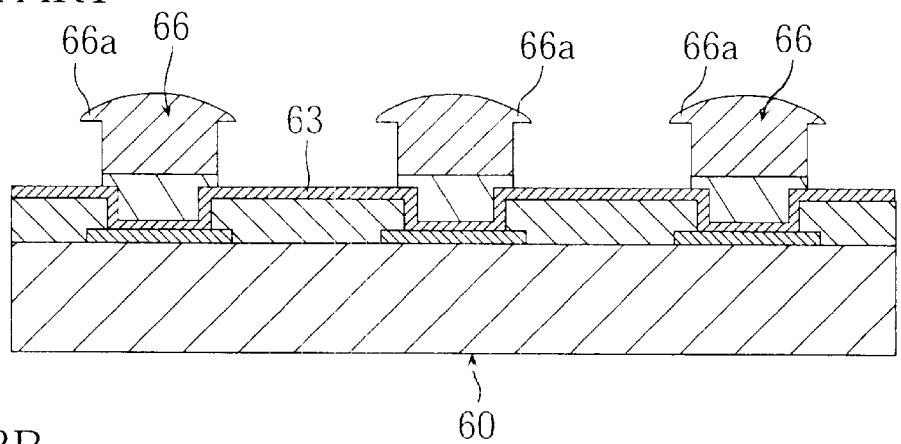
FIGS. 13a–13c illustrate process steps subsequent to the process step shown in FIG. 12c.
Figure 13B:
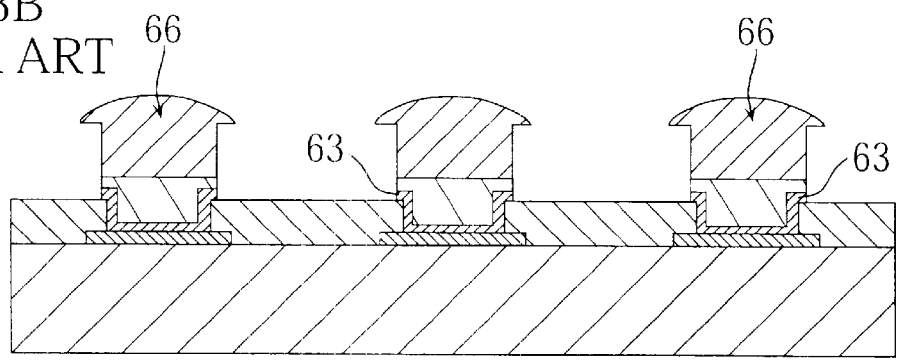
Figure 13C:
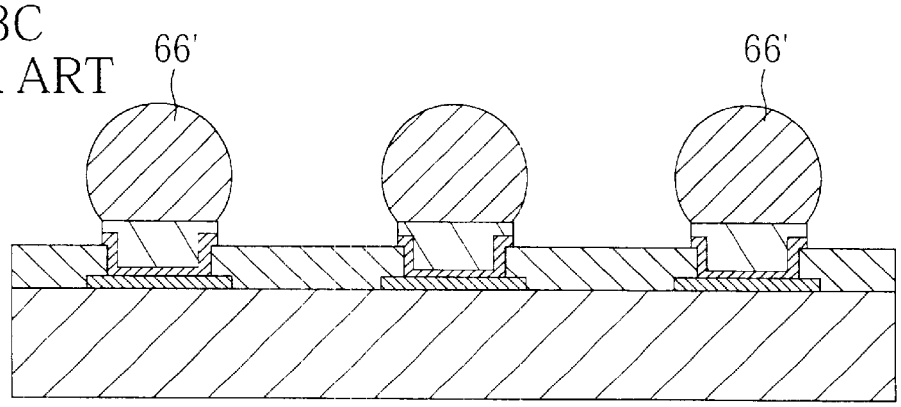

Then, as shown in FIG. 10b, the resin film 30 is removed from the surface of the semiconductor substrate 10. The resin film may be removed with the use of a stripping agent such as alkaline solution. Details of the stripping agent are as described with respect to the first embodiment. Subsequently, as shown in FIG. 10c, the conductor film 24, which is exposed, is etched away using an appropriate etchant. In this way, there is provided a semiconductor device X provided with plural solder bumps 43 as terminals for external connection. As shown in FIG. 10d, the configuration of the solder bumps 43 of the semiconductor device X may be adjusted through the process steps described as to the first embodiment with reference to FIGS. 3b and 3c.

In the semiconductor device making method of this embodiment, the openings 30a are formed in the resin film 30 with high positional accuracy by photolithography. Therefore, the solder plating 42 as the bump material can be supplied accurately to each of the electrode portions 11 even when the electrode portions are arranged at a small pitch. In this way, it is possible, in this embodiment, to load an appropriate amount of solder plating 42 with positional accuracy so that solder bumps 43 can be formed highly accurately at the electrode portions 11 arranged at a minute pitch.

In the semiconductor device making method of this embodiment, the resin film 30 formed on the semiconductor substrate 10 as a mask for forming bumps is removed after the solder plating 42 loaded in the openings 30a is heated to provide the solder bumps 43. That is, the resin film 30 is removed after the overhung portions 42a disappear. Therefore, the resin film 30 can be removed properly without the hindrance by the overhung portions 42a. Since the resin film 30 is properly removed, when the semiconductor device X is flip-chip bonded to the wiring board 70 as shown in FIG. 5, the under-filling material 72 can be properly loaded between the semiconductor device X and the wiring board 70. As a result, reliable connection can be provided between the semiconductor device X and the wiring board 70.

EXAMPLES

Next, examples of the present invention will be described. Examples 1–6 correspond to the first embodiment, examples 7–12 correspond to the second embodiment and examples 13–16 correspond to the third embodiment.

Example 1

A wafer formed with 120 semiconductor devices each provided with 3000 Al electrodes (electrode diameter: 70 μm, electrode pitch: 150 μm) was immersed in zincate treatment liquid (Tradename: ALUMON EN, manufactured by Meltex Inc.) at 30° C. for five minutes. As a result, a Zn film as a catalyst layer having a thickness of 0.1 μm was formed on each of the Al electrodes. Subsequently, the wafer was immersed in an electroless Ni—P plating solution (Tradename: NIMUDEN NPR-4, manufactured by C. Uyemura & Co., Ltd.) at 80° C. for 30 minutes. As a result, an Ni—P layer as a nickel layer having a thickness of 6 μm was formed on the Al electrode via the Zn film. Then, the wafer was immersed in an electroless Au plating solution (Tradename: PRECIOUSFAB IG7903, manufactured by Electroplating Engineers of Japan Ltd.) at 60° C. for 5 minutes. As a result, an Au film having a thickness of 0.1 μm was formed on the nickel layer. In this way, a barrier metal layer was formed on each of the Al electrodes.

Subsequently, a film of acrylate resin (Tradename: NIT-250, manufactured by Nichigo-Morton Co., Ltd.) having a thickness of 50 μm as a resin film was bonded, by thermocompression, onto the barrier-metal layer side of the wafer at 105° C. under a load of 3.5 kgf/cm$^2$. Then, the acrylate resin film was exposed to light at portions other than the portions corresponding to the electrodes by the use of a glass mask and then immersed in 2.3% aqueous solution of tetramethyl ammonium hydroxide. As a result, openings having a diameter of 125 μm were formed in the acrylate resin film at locations corresponding to the electrodes.

Then, solder paste containing solder powder of 63% Sn—Pb eutectic solder having a particle size of no more than 25 μm was loaded into the openings of the acrylate resin film by squeegeeing twice. Subsequently, the solder paste was heated at 220° C. for temporary melting, thereby forming a solder bump on each of the Al electrodes. Then, by immersing into aqueous solution containing 5% monoethanolamine as alkaline component and 1% sodium vanadate as a corrosion inhibitor, the acrylate resin film on the wafer was removed.

Subsequently, a flux (Tradename: R5003, manufactured by Alpha Metals Japan, Ltd.) was applied to the solder bumps. Then, the solder bumps were heated at 220° C. for temporary melting, thereby adjusting the configuration of the solder bumps on the Al electrodes. As a result, there were provided highly uniform solder bumps having a height of 75 μm with height deviation of 1.5 μm. The height deviation herein is based on the standard deviation σ of statistics.

Example 2

A wafer formed with 120 semiconductor devices each provided with 3000 Al electrodes (electrode diameter: 70 μm, electrode pitch: 150 μm) was immersed in Pd treatment liquid (Tradename: ENPLATEACTIVATOR 440, manufactured by Meltex Inc.) at 30° C. for seven minutes. As a result, a Pd film as a catalyst layer having a thickness of 0.1 μm was formed on each of the Al electrodes. Subsequently, in the manner similar to Example 1, an Ni—P layer and then an Au film were formed on the Al electrode via the Pd film. In this way, a barrier metal layer was formed on each of the Al electrodes.

After the formation of the barrier metal layer, similarly to Example 1, bonding of an acrylate resin film by thermocompression, forming of openings in the resin film, loading of solder paste in the openings, forming of solder bumps, removing of the acrylate resin film, applying of a flux to the solder bumps, and adjusting of the configuration of the solder bumps were performed. As a result, there were provided highly uniform solder bumps having a height of 74.5 μm with height deviation of 1.5 μm.

Example 3

A wafer formed with 120 semiconductor devices each provided with 3000 Al electrodes (electrode diameter: 70 µm, electrode pitch: 150 µm) was immersed in zincate treatment liquid (Tradename: ALUMON EN, manufactured by Meltex Inc.) at 30° C. for five minutes. As a result, a Zn film as a catalyst layer having a thickness of 0.1 µm was formed on each of the Al electrodes. Subsequently, the wafer was immersed in an electroless Ni—B plating solution (Tradename: NIBORON EN, manufactured by Worldmetal Co., Ltd.) at 80° C. for 40 minutes. As a result, an Ni—B layer as a nickel layer having a thickness of 6 µm was formed on the Al electrode via the Zn film. Then, in a manner similar to Example 1, an Au film was formed on the Ni—B layer. In this way, a barrier metal layer was formed on each of the Al electrodes.

After the formation of the barrier metal layer, similarly to Example 1, bonding of an acrylate resin film by thermo-compression, forming of openings in the resin film, loading of solder paste in the openings, forming of solder bumps, removing of the acrylate resin film, applying of a flux to the solder bumps, and adjusting of the configuration of the solder bumps were performed. As a result, there were provided highly uniform solder bumps having a height of 75 µm with height deviation of 1.4 µm.

Example 4

Bumps were formed in a manner basically similar to Example 1. However, in this example, instead of the solder paste containing 63% Sn—Pb eutectic solder powder, solder paste containing of Sn-3.5% Ag eutectic solder powder was used for loading into the openings of the acrylate resin film. Further, heating for forming bumps and for adjusting the configuration of the bumps was performed at 260° C., not 220° C. As a result, there were provided highly uniform solder bumps having a height of 75 µm with height deviation of 1.3 µm.

Example 5

Bumps were formed in a manner basically similar to Example 1. However, in this example, to adjust the bump configuration, instead of heating and melting the solder bumps at 220° C. after the application of a flux to the solder bumps, 70% aqueous solution of formic acid was applied to the solder bumps under a reduced pressure (100 torr) while heating and melting the solder bumps at 220° C. As a result, there were provided highly uniform solder bumps having a height of 75.5 µm with height deviation of 1.5 µm.

Example 6

Bumps were formed in a manner basically similar to Example 1. However, in this example, instead of the wafer formed with 120 semiconductor devices each provided with 3000 Al electrodes (electrode diameter: 70 µm, electrode pitch: 150 µm), use was made of a wafer formed with 120 semiconductor devices each provided with 3000 Cu electrodes (electrode diameter: 70 µm, electrode pitch: 150 µm). As a result, there were provided highly uniform solder bumps having a height of 74 µm with height deviation of 1.5 µm.

Example 7

A wafer formed with 120 semiconductor devices each provided with 3000 Al electrodes (electrode diameter: 70 µm, electrode pitch: 150 µm) was prepared. Onto the electro-deformed surface side of the wafer, a film of acrylate resin (Tradename: NIT-250 manufactured by Nichigo-Morton Co., Ltd.) as a resin film having a thickness of 50 µm was bonded by thermo-compression at 105° C. under a load of 3.5 kgf/cm². Then, the acrylate resin film was exposed to light at portions other than the portions corresponding to the electrodes by the use of a glass mask and then immersed in 2.3% aqueous solution of tetramethyl ammonium hydroxide. As a result, openings having a diameter of 125 µm were formed in the acrylate resin film at locations corresponding to the electrodes. Then, the wafer was immersed in zincate treatment liquid (Tradename: ALUMON EN, manufactured by Meltex Inc.) at 30° C. for five minutes. As a result, a Zn film as a catalyst layer having a thickness of 0.1 µm was formed on each of the Al electrodes. Subsequently, the wafer was immersed in an electroless Ni—P plating solution (Tradename: NIMUDEN NPR-4, manufactured by C. Uyemura & Co., Ltd.) at 80° C. for 30 minutes. As a result, an Ni—P layer as a nickel layer having a thickness of 6 µm was formed on the Al electrode via the Zn film. Then, the wafer was immersed in an electroless Au plating solution (Tradename: PRECIOUSFAB IG7903, Electroplating Engineers of Japan Ltd.) at 60° C. for 5 minutes. As a result, an Au film having a thickness of 0.1 µm was formed on the nickel layer. In this way, a barrier metal layer was formed on each of the Al electrodes.

Then, solder paste containing solder powder of 63% Sn—Pb eutectic solder having a particle size of no more than 25 µm was loaded into the openings of the acrylate resin film by squeegeeing twice. Subsequently, the solder paste was heated at 220° C. for temporary melting, thereby forming a solder bump on each of the Al electrodes formed with the barrier metal layer as described above. Then, by immersing into an aqueous solution containing 5% monoethanolamine as alkaline component and 1% sodium vanadate as a corrosion inhibitor, the acrylate resin film on the wafer was removed. Subsequently, a flux (Tradename: R5003 manufactured by Alpha Metals Japan, Ltd.) was applied to the solder bumps. Then, the solder bumps were heated at 220° C. for temporary melting, thereby adjusting the configuration of the solder bumps on the Al electrodes. As a result, there were provided highly uniform solder bumps having a height of 70 µm with height deviation of 1.5 µm.

Example 8

A wafer formed with 120 semiconductor devices each provided with 3000 Al electrodes (electrode diameter: 70 µm, electrode pitch: 150 µm) was prepared. Onto the electro-deformed surface side of the wafer, a film of acrylate resin (Tradename: NIT-250, manufactured by Nichigo-Morton Co., Ltd.) as a resin film having a thickness of 50 µm was bonded by thermo-compression at 105° C. under a load of 3.5 kgf/cm². Then, the acrylate resin film was exposed to light at portions other than the portions corresponding to the electrodes by the use of a glass mask and then immersed in 2.3% aqueous solution of tetramethyl ammonium hydroxide. As a result, openings having a diameter of 125 µm were formed in the acrylate resin film at locations corresponding to the electrodes. Then, the wafer was immersed in Pd treatment liquid (Tradename: ENPLATEACTIVATOR 440, manufactured by Meltex Inc.) at 30° C. for seven minutes. As a result, a Pd film as a catalyst layer having a thickness of 0.1 µm was formed on each of the Al electrodes. Subsequently, in a manner similar to Example 7, an Ni—P layer and then an Au film were formed on the Al electrode via the Pd film. In this way, a barrier metal layer was formed on each of the Al electrodes.

After the formation of the barrier metal layer, similarly to Example 7, loading of solder paste in the openings of the acrylate resin film, forming of solder bumps, removing of the acrylate resin film, applying of a flux to the solder bumps, and adjusting of the configuration of the solder bumps were performed. As a result, there were provided highly uniform solder bumps having a height of 69 μm with height deviation of 1.3 μm.

Example 9

A wafer formed with 120 semiconductor devices each provided with 3000 Al electrodes (electrode diameter: 70 μm, electrode pitch: 150 μm) was prepared. Onto the electrode-formed surface side of the wafer, a film of acrylate resin (Tradename: NIT-250, manufactured by Nichigo-Morton Co., Ltd.) as a resin film having a thickness of 50 μm was bonded by thermo-compression at 105° C. under a load of 3.5 kgf/cm$^2$. Then, the acrylate resin film was exposed to light at portions other than the portions corresponding to the electrodes by the use of a glass mask and then immersed in 2.3% aqueous solution of tetramethyl ammonium hydroxide. As a result, openings having a diameter of 125 μm were formed in the acrylate resin film at locations corresponding to the electrodes. Then, the wafer was immersed in zincate treatment liquid (Tradename: ALUMON EN, manufactured by Meltex Inc.) at 30° C. for five minutes. As a result, a Zn film as a catalyst layer having a thickness of 0.1 μm was formed on each of the Al electrodes. Subsequently, the wafer was immersed in an electroless Ni—B plating solution (Tradename: NIBORON, manufactured by Worldmetal Co., Ltd.) at 80° C. for 40 minutes. As a result, an Ni—B layer as a nickel layer having a thickness of 6 μm was formed on the Al electrode via the Zn film. Then, in a manner similar to Example 7, an Au film was formed on the Ni—B layer. In this way, a barrier metal layer was formed on each of the Al electrodes.

After the formation of the barrier metal layer, similarly to Example 7, loading of solder paste in the openings of the acrylate resin film, forming of solder bumps, removing of the acrylate resin film, applying of a flux to the solder bumps, and adjusting of the configuration of the solder bumps were performed. As a result, there were provided highly uniform solder bumps having a height of 70 μm with height deviation of 1.5 μm.

Example 10

Bumps were formed in a manner similar to Example 7. However, in this example, instead of the solder paste containing 63% Sn—Pb eutectic solder powder, solder paste containing Sn-3.5% Ag eutectic solder powder was used for loading into the openings of the acrylate resin film. Further, heating for forming bumps and for adjusting the configuration of the bumps was performed at 260° C., not 220° C. As a result, there were provided highly uniform solder bumps having a height of 70 μm with height deviation of 1.2 μm.

Example 11

Bumps were formed in a manner basically similar to Example 7. However, in this example, to adjust the bump configuration, instead of heating and melting the solder bumps at 220° C. after the application of a flux to the solder bumps, 70% aqueous solution of formic acid was applied to the solder bumps under a reduced pressure (100 torr) while heating and melting the solder bumps at 220° C. As a result, there were provided highly uniform solder bumps having a height of 71 μm with height deviation of 1.5 μm.

Example 12

Bumps were formed in a manner basically similar to Example 7. However, in this example, instead of the wafer formed with 120 semiconductor devices each provided with 3000 Al electrodes (electrode diameter: 70 μm, electrode pitch: 150 μm), use was made of a wafer formed with 120 semiconductor devices each provided with 3000 Cu electrodes (electrode diameter: 70 μm, electrode pitch: 150 μm). As a result, there were provided highly uniform solder bumps having a height of 70 μm with height deviation of 1.5 μm.

Example 13

A wafer formed with 120 semiconductor devices each provided with 3000 Al electrodes (electrode diameter: 70 μm, electrode pitch: 150 μm) was prepared. Onto the electrode-formed surface side of the wafer, a Ti layer (thickness: 0.1 μm) and then an Ni layer (thickness: 0.1 μm) were formed by sputtering as a seed layer (conductor film) for electroplating. Then, a film of acrylate resin (Tradename: NIT-225 manufactured by Nichigo-Morton Co., Ltd.) as a resin film having a thickness of 25 μm was bonded by thermo-compression at 105° C. under a load of 3.5 kgf/cm$^2$. Then, the acrylate resin film was exposed to light at portions other than the portions corresponding to the electrodes by the use of a glass mask and then immersed in 2.3% aqueous solution of tetramethyl ammonium hydroxide. As a result, openings having a diameter of 125 μm were formed in the acrylate resin film at locations corresponding to the electrodes. Subsequently, the wafer was immersed in an electrolytic Ni plating solution (Tradename: MICROFAB Ni100, manufactured by EEJA: Electroplating Engineers of Japan Ltd.) for undergoing plating treatment at a current density of 0.3 A/dm$^2$. As a result, a nickel layer having a thickness of 6 μm was formed. Then, the wafer was immersed in an electrolytic 63% Sn—Pb eutectic solder plating solution (Tradename: MXM03069-574A1, manufactured by Ishihara Chemical Co., Ltd.) for undergoing plating treatment at a current density of 0.3 A/dm$^2$. As a result, a solder layer having a thickness of 330 μm was formed on the nickel layer. Subsequently, the solder plating was heated at 220° C. for temporary-melting, thereby forming a solder bump on each of the Al electrodes.

Then, by immersing into an aqueous solution containing 5% monoethanolamine as alkaline component and 1% sodium vanadate as a corrosion inhibitor, the acrylate resin film on the wafer was removed. Subsequently, a flux (Tradename: R5003, manufactured by Alpha Metals Japan, Ltd.) was applied to the solder bumps. Then, the solder bumps were heated at 220° C. for temporary melting, thereby adjusting the configuration of the solder bumps on the Al electrodes. As a result, there were provided highly uniform solder bumps having a height of 74 μm with height deviation of 1.5 μm.

Example 14

Bumps were formed in a manner basically similar to Example 13. However, in this example, instead of the electrolytic 63% Sn—Pb eutectic solder plating solution (Tradename: MXM03069-574A1, manufactured by Ishihara Chemical Co., Ltd.), an electrolytic Sn-3.5% Ag eutectic solder plating solution (Tradename: TS-140BASE, manufactured by Ishihara Chemical Co., Ltd.) was used for forming a solder layer. Further, heating for forming bumps and for adjusting the configuration of the bumps was performed at 260° C., not 220° C. As a result, there were provided highly uniform solder bumps having a height of 75 μm with height deviation of 1.5 μm.

Example 15

Bumps were formed in a manner basically similar to Example 13. However, in this example, instead of the wafer formed with 120 semiconductor devices each provided with 3000 Al electrodes (electrode diameter: 70 μm, electrode pitch: 150 μm), use was made of a wafer formed with 120 semiconductor devices each provided with 3000 Cu electrodes (electrode diameter: 70 μm, electrode pitch: 150 μm). As a result, there were provided highly uniform solder bumps having a height of 74 μm with height deviation of 1.5 μm.

Example 16

Bumps were formed in a manner basically similar to Example 13. However, in this example, to adjust the bump configuration, instead of once heating and melting the solder bumps at 220° C. after the application of a flux to the solder bumps, 70% aqueous solution of formic acid was applied to the solder bumps under a reduced pressure (100 torr) while heating and melting the solder bumps at 220° C. As a result, there were provided highly uniform solder bumps having a height of 74 μm with height deviation of 1.5 μm.

According to the present invention, in forming a semiconductor device, bumps can be formed with high accuracy at electrode portions arranged at a minute pitch. Further, according to the present invention, it is possible to make a semiconductor device which can be connected to a connection object with high reliability. Such a semiconductor device obtained by the present invention is suitable for high-density mounting.

What is claimed is:

1. A method of making a semiconductor device which includes a semiconductor substrate provided with electrode portions, the method comprising:
   a barrier metal layer forming operation to form a barrier metal layer on each of the electrode portions by electroless plating;
   a resin film forming operation to form a resin film on the semiconductor substrate to cover the electrode portions;
   an opening forming operation to form openings in the resin film at locations corresponding to the electrode portions to expose the respective barrier metal layers;
   a loading operation to load a bump material in the openings;
   a bump forming operation to form bumps in the openings by heating the bump material; and
   a removing operation to remove the resin film.

2. The method of making a semiconductor device according to claim 1, wherein the resin film forming operation comprises bonding the resin film to the semiconductor substrate.

3. The method of making a semiconductor device according to claim 2, wherein the barrier metal layer forming operation includes the operations of:
   forming a catalyst layer on the electrode portion;
   forming an electroless nickel plating layer having a composition of one of: Ni—P, Ni—B and Ni—P—B on the catalyst layer; and
   forming one of: an electroless gold plating layer and an electroless palladium plating layer on the electroless nickel plating layer.

4. The method of making a semiconductor device according to claim 3, wherein the catalyst layer comprises one of: Zn and Pd.

5. A method of making a semiconductor device which includes a semiconductor substrate provided with electrode portions, the method comprising:
   a resin film forming operation to form a resin film on the semiconductor substrate to cover the electrode portions:
   an opening forming operation to form openings in the resin film at locations corresponding to the electrode portions;
   a barrier metal layer forming operation to form a barrier metal layer on each of the electrode portions by electroless plating;
   a loading operation to load a bump material in the openings;
   a bump forming operation to form bumps in the openings by heating; and
   a removing operation to remove the resin film.

6. The method of making a semiconductor device according to claim 5, wherein the barrier metal layer forming operation includes operations of:
   forming a catalyst layer on the electrode portion;
   forming an electroless nickel plating layer having a composition of one of: Ni—P, Ni—B and Ni—P—B on the catalyst layer; and
   forming one of: an electroless gold plating layer and an electroless palladium plating layer on the electroless nickel plating layer.

7. The method of making a semiconductor device according to claim 6, wherein the catalyst layer comprises one of: Zn and Pd.

8. The method of making a semiconductor device according to claim 1, wherein the bump material is solder paste comprising a solder powder having a metal selected from the group consisting of Sn, Pb, Cu, Ag, In, Zn, Bi, Sb and Au.

9. A method of making a semiconductor device which includes a semiconductor substrate provided with electrode portions, the method comprising:
   a conductor film forming operation to form a conductor film on the semiconductor substrate to cover the electrode portions;
   a resin film forming operation to form a resin film on the semiconductor substrate to cover the electrode portions;
   an opening forming operation to form openings in the resin film at locations corresponding to the electrode portions;
   a barrier metal layer forming operation to form a barrier metal layer on each of the electrode portions by electroplating;
   a loading operation to deposit a bumP material onto the barrier metal layers in the openings by electroplating;
   a bump forming operation to form bumps in the openings by heating; and
   a removing operation to remove the resin film.

10. The method of making a semiconductor device according to claim 1, wherein the resin film forming operation comprises bonding a film of photosensitive resin material as the resin film to the semiconductor substrate.

11. The method of making a semiconductor device according to claim 1, wherein the removing operation comprises removing the resin film by using a stripping agent having a pH of approximately 8–13.

12. The method of making a semiconductor device according to claim 11, wherein the stripping agent comprises amine.

13. The method of making a semiconductor device according to claim 11, wherein the stripping agent comprises a corrosion inhibitor to prevent the bumps from corroding.

14. The method of making a semiconductor device according to claim 11, wherein the stripping agent comprises a corrosion inhibitor to prevent the barrier metal layers and the electrode portions from corroding.

15. The method of making a semiconductor device according to claim 1, further comprising the operations of covering the bumps with one of: a flux and carboxylic acid and heating the bumps for temporary melting.

16. A method of forming bumps on a semiconductor substrate provided with electrode portions, comprising:

forming a barrier metal layer on each of the electrode portions by electroless plating;

forming a resin film on the semiconductor substrate to cover the electrode portions;

forming openings in the resin film at locations corresponding to the electrode portions;

loading a solder paste in the openings;

heating the solder paste loaded in the openings to melt the solder paste and form solder bumps on the electrode portions; and removing the resin film.

17. The method of forming bumps according to claim 16, wherein the forming the resin film comprises bonding the resin film to the semiconductor substrate.

18. The method of forming bumps according to claim 16, wherein the forming the barrier metal layer comprises:

forming a catalyst layer on the electrode portions;

forming an electroless nickel plating layer having a composition of one of: Ni—P, Ni—B and Ni—P—B on the catalyst layer; and forming one of: an electroless gold plating layer and an electroless palladium plating layer on the electroless nickel plating layer.

19. The method of forming bumps according to claim 16, wherein the catalyst layer comprises one of: Zn and Pd.

20. The method of forming bumps according to claim 16, wherein the resin film comprises a photosensitive resin material.

21. The method of forming bumps according to claim 16, wherein the removing the resin film is performed by using a stripping agent having a pH of approximately 8–13.

22. The method of forming bumps according to claim 21, wherein the stripping agent comprises amine.

23. The method of forming bumps according to claim 21, wherein the stripping agent comprises a corrosion inhibitor to prevent the bumps from corroding.

24. The method of forming bumps according to claim 21, wherein the stripping agent comprises a corrosion inhibitor to prevent the barrier metal layers and the electrode portions from corroding.

25. The method of forming bumps according to claim 16, further comprising covering the bumps with one of: a flux and carboxylic acid and heating the bumps for temporary melting.

26. A method of making a semiconductor device which includes a semiconductor substrate provided with electrode portions, comprising:

forming a resin film on the semiconductor substrate to cover the electrode portions;

forming openings in the resin film at locations corresponding to the electrode portions;

forming a barrier metal layer on each of the electrode portions by electroless plating;

loading a bump material in the openings;

forming bumps in the openings by heating the loaded bump material; and removing the resin film.

27. A method of making a semiconductor device which includes a semiconductor substrate provided with electrode portions, comprising:

forming a conductor film on the semiconductor substrate to cover the electrode portions;

forming a resin film on the semiconductor substrate to cover the electrode portions;

forming openings in the resin film at locations corresponding to the electrode portions;

electroplating a barrier metal layer on each of the electrode portions;

depositing a bump material onto the barrier metal layers in the openings by electroplating;

forming bumps in the openings by heating the deposited bump material; and removing the resin film.

* * * * *